United States Patent
Lin et al.

(10) Patent No.: US 7,790,535 B2
(45) Date of Patent: Sep. 7, 2010

(54) DEPLETION-FREE MOS USING ATOMIC-LAYER DOPING

(75) Inventors: Jing-Cheng Lin, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 131 days.

(21) Appl. No.: 12/211,546

(22) Filed: Sep. 16, 2008

(65) Prior Publication Data

US 2010/0068873 A1     Mar. 18, 2010

(51) Int. Cl.
*H01L 21/20* (2006.01)
(52) U.S. Cl. ............... 438/188; 438/195; 438/196; 438/199; 438/240; 438/302; 257/E21.209; 257/E21.267; 257/E21.324; 257/E21.336; 257/E21.637; 257/E29.079; 257/E29.162
(58) Field of Classification Search ......... 438/188–199, 438/240, 302, 558, 591, 778, 785; 257/E21.209, 257/267, 324, 336, 637, 29.079, 162
See application file for complete search history.

(56) References Cited

U.S. PATENT DOCUMENTS

| | | | |
|---|---|---|---|
| 5,310,698 A * | 5/1994 | Wild | 438/658 |
| 5,491,107 A * | 2/1996 | Turner et al. | 438/486 |
| 5,527,733 A * | 6/1996 | Nishizawa et al. | 438/558 |
| 5,582,640 A * | 12/1996 | Okada et al. | 117/8 |
| 5,840,607 A | 11/1998 | Yeh et al. | |
| 6,033,950 A | 3/2000 | Chen et al. | |
| 6,090,651 A * | 7/2000 | Puchner et al. | 438/199 |
| 6,171,939 B1 | 1/2001 | Lin | |
| 6,380,055 B2 | 4/2002 | Gardner et al. | |

(Continued)

OTHER PUBLICATIONS

Chiba, Y., et al., "Epitaxial growth of P atomic layer doped Si film by alternate surface reactions of $PH_3$ and $Si_2H_6$ on strained $Si_{1-x}Ge_x$/Si(1 0 0) in ultraclean low-pressure CVD," Semiconductor Science and Technology, vol. 22 (2007), pp. S118-S122, Institute of Physics Publishing.

(Continued)

*Primary Examiner*—Michael S Lebentritt
(74) *Attorney, Agent, or Firm*—Slater & Matsil, L.L.P.

(57) ABSTRACT

A semiconductor device and a method of manufacturing are provided. A dielectric layer is formed over a substrate, and a first silicon-containing layer, undoped, is formed over the dielectric layer. Atomic-layer doping is used to dope the undoped silicon-containing layer. A second silicon-containing layer is formed over first silicon-containing layer. The process may be expanded to include forming a PMOS and NMOS device on the same wafer. For example, the first silicon-containing layer may be thinned in the PMOS region prior to the atomic-layer doping. In the NMOS region, the doped portion of the first silicon-containing layer is removed such that the remaining portion of the first silicon-containing layer in the NMOS is undoped. Thereafter, another atomic-layer doping process may be used to dope the first silicon-containing layer in the NMOS region to a different conductivity type. A third silicon-containing layer may be formed doped to the respective conductivity type.

20 Claims, 28 Drawing Sheets

U.S. PATENT DOCUMENTS

| | | | |
|---|---|---|---|
| 6,541,353 | B1 | 4/2003 | Sandhu et al. |
| 6,670,226 | B2 | 12/2003 | Lin et al. |
| 6,908,803 | B2 | 6/2005 | Schuegraf et al. |
| 6,933,214 | B2 * | 8/2005 | Kwak .................. 438/522 |
| 7,049,192 | B2 * | 5/2006 | Ahn et al. ............. 438/240 |
| 7,144,750 | B2 * | 12/2006 | Ouellet et al. ........... 438/50 |
| 7,273,657 | B2 * | 9/2007 | Atanackovic .......... 428/446 |
| 7,427,561 | B2 | 9/2008 | Lee |
| 7,510,943 | B2 | 3/2009 | Li |
| 2005/0059228 | A1 | 3/2005 | Bu et al. |
| 2008/0194087 | A1 | 8/2008 | Yu et al. |

OTHER PUBLICATIONS

Ishihara, T., et al., "Modeling of screening effect on remote Coulomb scattering due to gate impurities by nonuniform free carriers in poly-Si gate," Journal of Applied Physics, vol. 102, No. 073702, (2007) pp. 1-18, American Institute of Physics.

Murota, J., et al., "Atomically Controlled Processing for Group IV Semiconductors by Chemical Vapor Deposition," Japanese Journal of Applied Physics, vol. 45, No. 9A (2006) pp. 6767-6785.

Sato, T., et al., "Dominant Factor for the Concentration of Phosphorus Introduced by Vapor Phase Doping (VPD)," Japanese Journal of Applied Physics, vol. 37 (1998) pp. 1162-1165.

* cited by examiner

DEPLETION-FREE MOS USING ATOMIC-LAYER DOPING

TECHNICAL FIELD

The present invention relates generally to semiconductor devices and, more particularly, to forming metal-oxide-semiconductor devices.

BACKGROUND

Metal-oxide-semiconductor (MOS) devices are basic building elements in integrated circuits. In conventional MOS devices, gate electrodes often comprise polysilicon doped with p-type or n-type impurities, using doping operations such as ion implantation or thermal diffusion. FIG. 1 illustrates a conventional MOS device having an implanted gate electrode. In a typical formation process, after forming a gate stack including gate dielectric 4 and polysilicon gate electrode 6, implantations are performed to dope impurities. The implantations typically include an implantation to form lightly-doped source and drain regions and an implantation to form deep source and drain regions.

Some MOS devices such as those with polysilicon gate electrodes exhibit a carrier depletion effect, also referred to as a poly depletion effect or polysilicon depletion. The poly depletion effect occurs when an applied electrical field sweeps away carriers from a region of gate electrode 6 close to gate dielectric 4, forming a depletion layer. In n-doped polysilicon, the depletion layer includes ionized non-mobile donor sites. Whereas in p-doped polysilicon, the depletion layer includes ionized non-mobile acceptor sites. The depletion effect increases the effective gate dielectric thickness, making it more difficult for an inversion layer to be created at the surface of the semiconductor.

Typically, implanted impurities have a high doping concentration in an upper portion of gate electrode 6, while in region 8 of gate electrode 6, which is a lower portion close to gate dielectric 4, the impurity concentration is low. The low impurity concentration at the interface region of gate electrode 6 and gate dielectric 4 increases the likelihood of poly depletion.

FIG. 2 illustrates an intermediate stage of an attempt to solve the poly depletion problem. After a gate dielectric layer 12 is formed on substrate 10, polysilicon layer 14 is formed on gate dielectric layer 12. Polysilicon layer 14 is in-situ doped during its formation with a p-type or an n-type impurity. Assuming a p-type impurity is in-situ doped, a portion of polysilicon layer 14 in NMOS region 16 is removed, exposing underlying gate dielectric layer 12, while a portion of polysilicon layer 14 in PMOS region 18 is left un-removed. In subsequent steps, as shown in FIG. 3, polysilicon layer 20, which is in-situ doped with an n-type impurity, is formed in NMOS region 16. In subsequent steps, polysilicon layers 14 and 20 are then patterned to formed gate stacks. By in-situ doping impurities, the interface regions will have high impurity concentrations, and the polysilicon depletion problem is solved.

The removal of polysilicon layer 14 from NMOS region 16, however, will cause a top portion of the underlying gate dielectric layer 12 to be removed, thus resulting in variations in the thickness of the gate dielectric layer 12. Variations in the thickness of gate dielectrics in the resulting MOS devices undesirably affects the performance of the MOS devices. In advanced technologies, wherein the thickness of gate dielectric layer 12 is reduced to about 15 Å or below, the variations in the thickness of gate dielectrics is significant. A solution is thus needed to eliminate, or at least reduce, the thickness variations.

SUMMARY OF THE INVENTION

These and other problems are generally reduced, solved or circumvented, and technical advantages are generally achieved, by embodiments of the present invention, which provides MOS devices, such as MOS field-effect transistors (MOSFETs), with ultra-shallow junctions.

In accordance with an embodiment of the present invention, a method of forming a semiconductor device is provided. A gate dielectric layer is formed on a semiconductor substrate, and an undoped first electrode layer is formed on the gate dielectric layer. The first electrode layer is doped at least in part using atomic-layer doping techniques. Thereafter, a second electrode layer is formed over the first electrode layer.

In accordance with another embodiment of the present invention, a method of forming a semiconductor is provided. A gate dielectric layer is formed on a semiconductor substrate in a PMOS region and an NMOS region, and a first undoped electrode layer is formed on the gate dielectric layer in the PMOS region and the NMOS region. The first electrode layer is doped to a first conductivity type using atomic-layer doping techniques. A second electrode layer is formed on the first electrode layer in the PMOS region, and a third electrode layer is formed on the first electrode layer in the NMOS region. The first electrode layer in the NMOS region may be doped using implantation or diffusion, for example.

In accordance with another embodiment of the present invention, a method of forming a semiconductor device is provided. A dielectric layer is formed on a semiconductor substrate in a first region and a second region, and a first silicon-containing layer is formed on the dielectric layer. An atomic-layer of a first conductivity type is formed on the first silicon-containing layer, and an anneal is performed to diffuse the atoms of the first conductivity type into the first silicon-containing layer. Thereafter, a second silicon-containing layer is formed on the first silicon-containing layer in the first region doped with the first conductivity type and a third silicon-containing layer is formed on the first silicon-containing layer doped with a second conductivity type.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present invention are described in the context of forming a polysilicon layer over a dielectric layer, such as that which may be used in forming a polysilicon gate electrode for illustrative purposes. Other embodiments may be used to form other structures, including capacitors, resistors, and the like.

Figure 1:
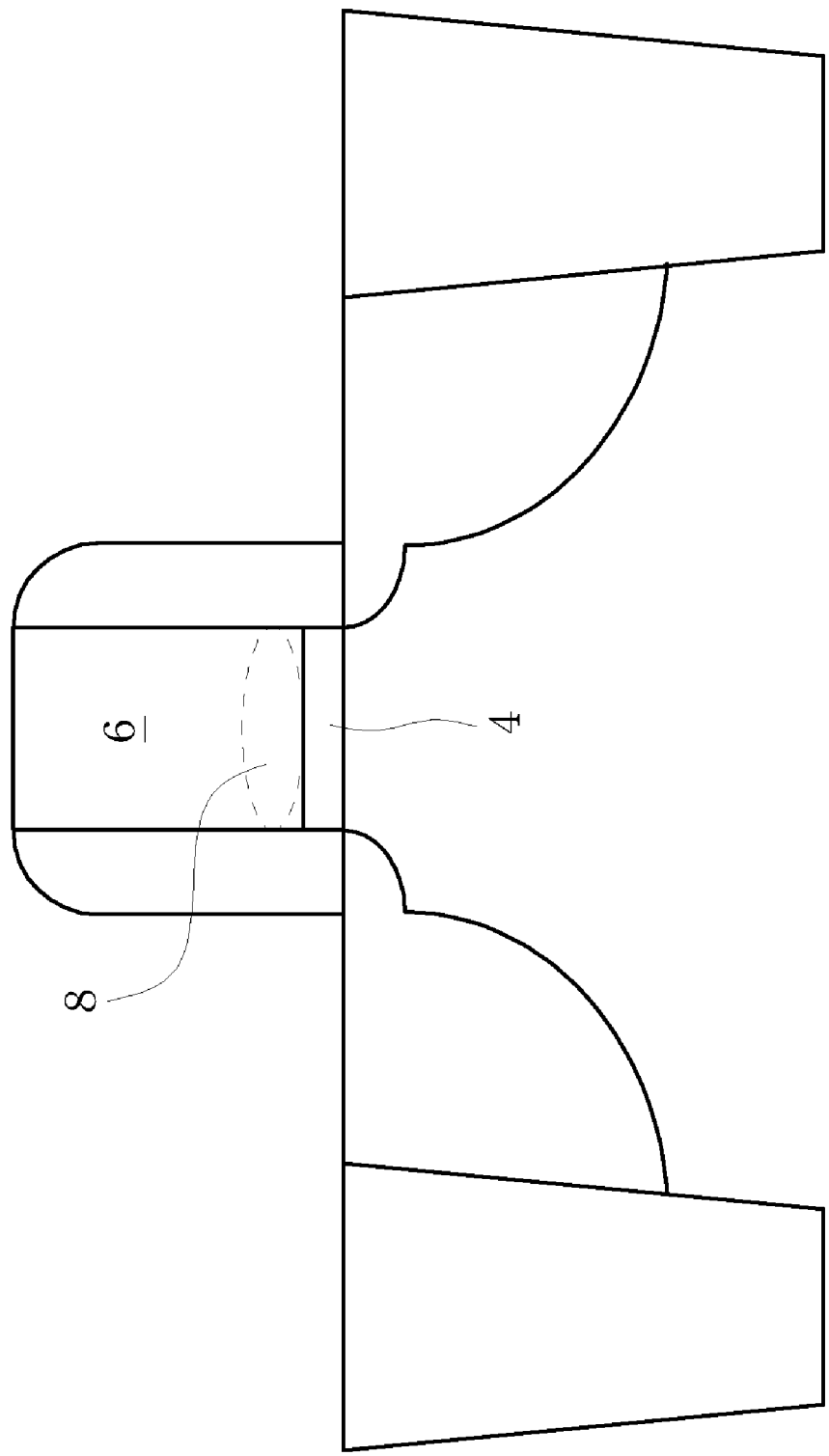
FIG. 1 illustrates a conventional MOS device, wherein impurities are introduced into a gate electrode by implantation.
Figure 2:
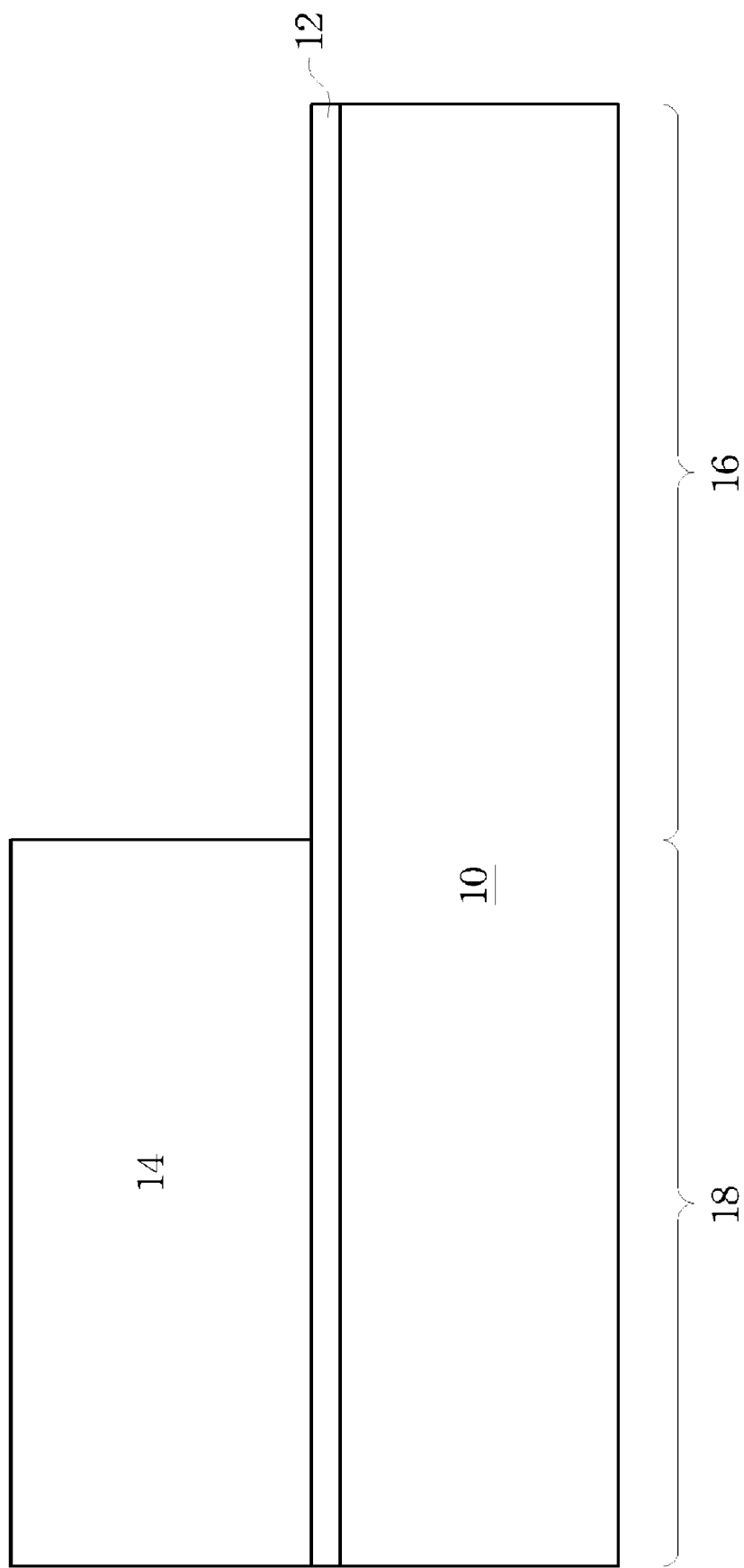
FIGS. 2 through 3 are cross-sectional views of intermediate stages in the manufacture of conventional PMOS and NMOS devices, wherein gate electrodes are in-situ doped.
Figure 3:
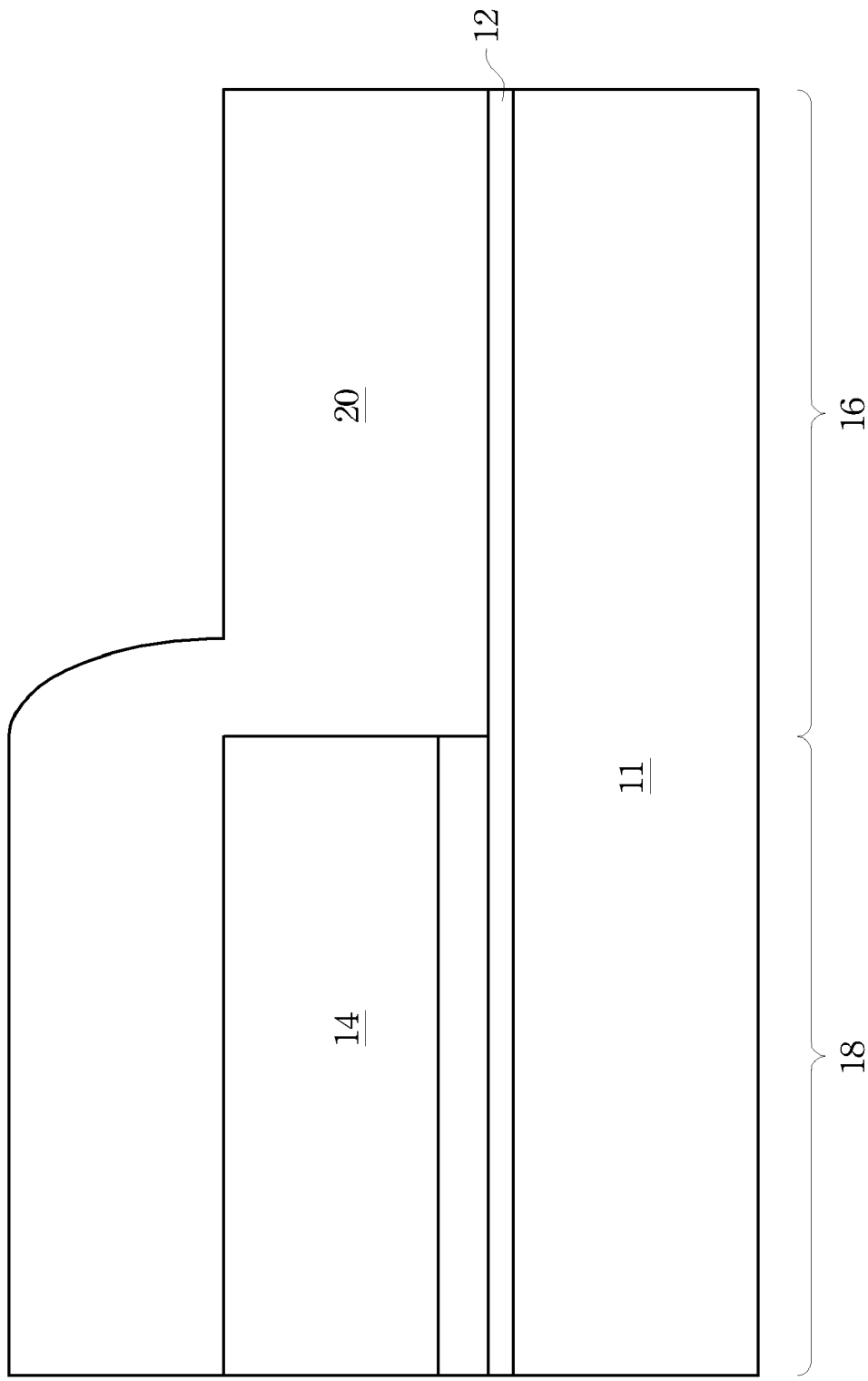
Figure 4:
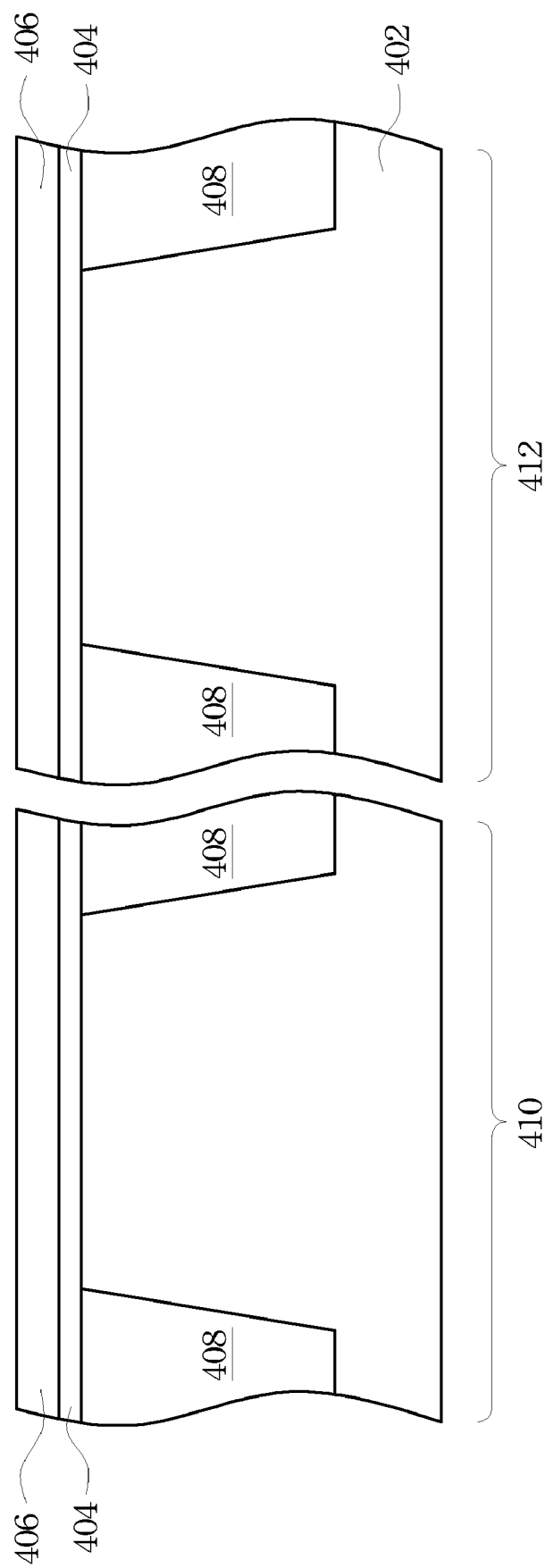
FIGS. 4-11 illustrate various intermediate process steps of a method of forming a semiconductor device.

FIGS. 4-11 illustrate a method of forming a gate electrode having a reduced depletion area in accordance with an embodiment of the present invention. Referring first to FIG. 4, there is shown a substrate 402 having a gate dielectric layer 404 and a first silicon-containing layer 406 formed thereon. The substrate 402 is preferably a silicon substrate, doped or undoped, though other materials, such as germanium, quartz, sapphire, and glass, could alternatively be used. Alternatively, the silicon substrate 402 may be an active layer of a semiconductor-on-insulator (SOI) substrate or a multi-layered structure such as a silicon-germanium layer formed on a bulk silicon layer.

The isolation structures 408 define a PMOS active region 410 and an NMOS active region 412. The isolation structures 408 may be formed using shallow trench isolation processes, for example, comprising the steps of etching trenches with depths in the range of about 2,000 Å to about 6,000 Å and filling the trenches with a dielectric material by chemical vapor deposition (CVD). The dielectric material may be silicon oxide, for example. Other types of isolation structures, such as field oxide regions, may also be used. Ion implantation may be performed to create n-type and/or p-type well regions (not shown) in the substrate 402 between the isolation structures 408.

In one embodiment, the gate dielectric layer 404 includes silicon oxide, which may be formed using any suitable gate dielectric formation process, e.g., thermal oxidation, nitridation, sputter deposition, or CVD. In an embodiment, the gate dielectric layer 404 may be formed of silicon oxide, silicon oxynitride, a high permittivity (high-k) gate dielectric, combinations thereof, or the like and have a thickness in the range of about 6 Å to about 18 Å. Suitable high-k dielectric materials include aluminum oxide ($Al_2O_3$), hafnium oxide ($HfO_2$), hafnium oxynitride (HfON), hafnium silicate ($HfSiO_4$), zirconium oxide ($ZrO_2$), zirconium oxynitride (ZrON), zirconium silicate ($ZrSiO_4$), yttrium oxide ($Y_2O_3$), lanthalum oxide ($La_2O_3$), cerium oxide ($CeO_2$), titanium oxide ($TiO_2$), and tantalum oxide ($Ta_2O_5$). Other materials, processes, and thicknesses may be used.

The first silicon-containing layer 406, which is formed on the gate dielectric layer 404, may be, for example, a polysilicon layer or an amorphous silicon layer. The formation methods include CVD methods such as low pressure CVD (LPCVD), plasma enhanced CVD (PECVD), and the like.

The precursors preferably include a silicon-containing gas such as silane. In an exemplary embodiment, the process conditions include a silane flow of between about 50 sccm and about 1000 sccm, a temperature between about 500° C. and about 650° C., and an ambient pressure of between about 0.1 torr and about 100 torr. In alternative embodiments, the first silicon-containing layer 406 comprises silicon germanium, which may be formed by further introducing a germanium-containing gas, such as $GeH_4$, into the ambient in addition to the silicon-containing gas. The first silicon-containing layer 406 is preferably un-doped. The thickness of the first silicon-containing layer 406 is preferably between about 30 Å and about 300 Å.

Figure 5:
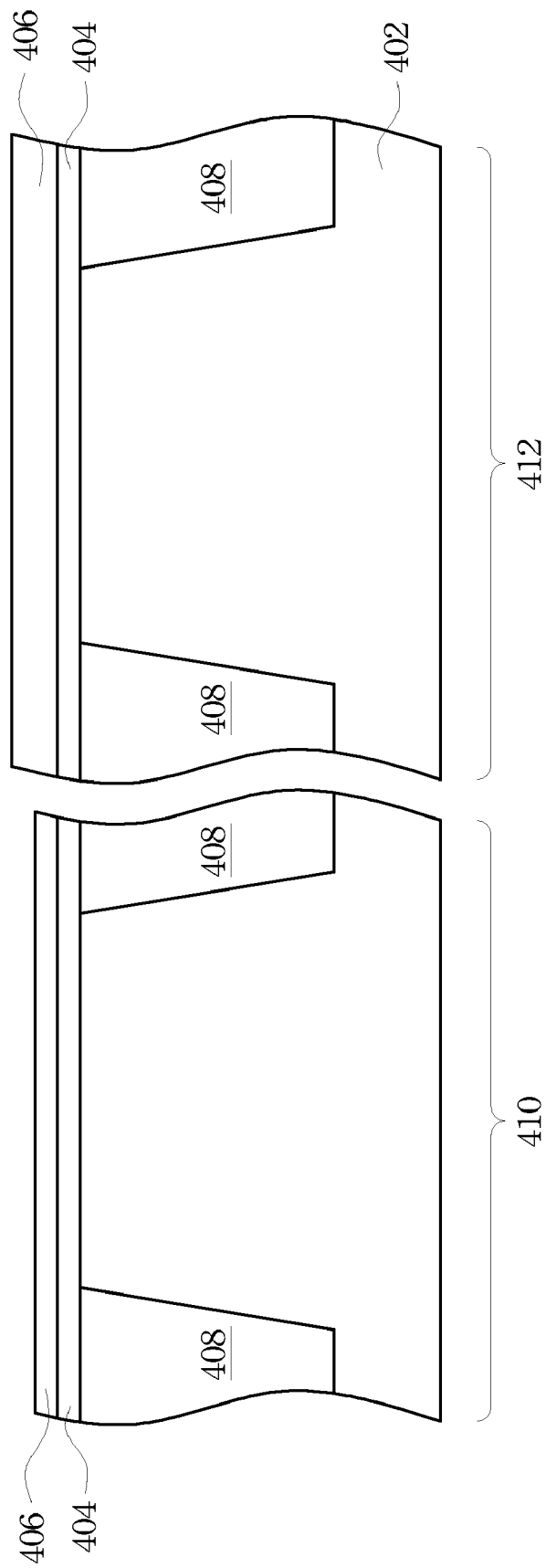

FIG. 5 illustrates the removal of a portion of the first silicon-containing layer 406 from PMOS active region 410. In an exemplary embodiment, a photoresist (not shown) is formed to mask NMOS active region 412. A timed dry etch is then performed by using, for example, HBr as an etchant such that only a portion of the first silicon-containing layer 406 is removed from the PMOS active region 410. It should be appreciated that the remaining layer of the first silicon-containing layer 406 protects the underlying gate dielectric layer 404 from becoming damaged during the etch process. In an embodiment, the remaining layer of the first silicon-containing layer 406 in the PMOS active region 410 has a thickness between about 20 Å and about 200 Å.

Figure 6:
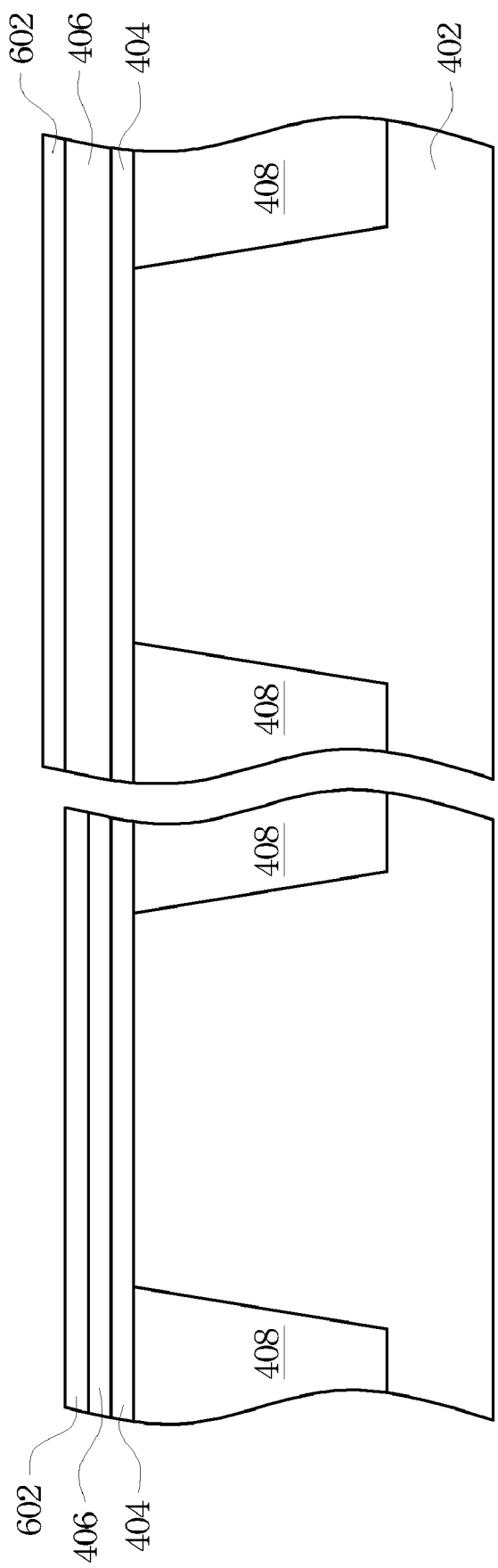

Thereafter, as illustrated in FIG. 6, an atomic layer 602 is formed on the first silicon-containing layer 406 in accordance with an embodiment of the present invention. Preferably, an atomic layer dopant growth process is utilized. In an embodiment such as that illustrated in FIG. 6 in which the first silicon-containing layer 406 of the PMOS active region 410 is being doped first, an atomic layer of p-type atoms may be formed using a reaction chamber at atmospheric or reduced pressure with a carrier gas such as $H_2/N_2$, $N_2/He$, $H_2/He$, or the like and a precursor of $B_2H_6$ or the like at a temperature between about 200° C. to about 600° C.

Figure 7:
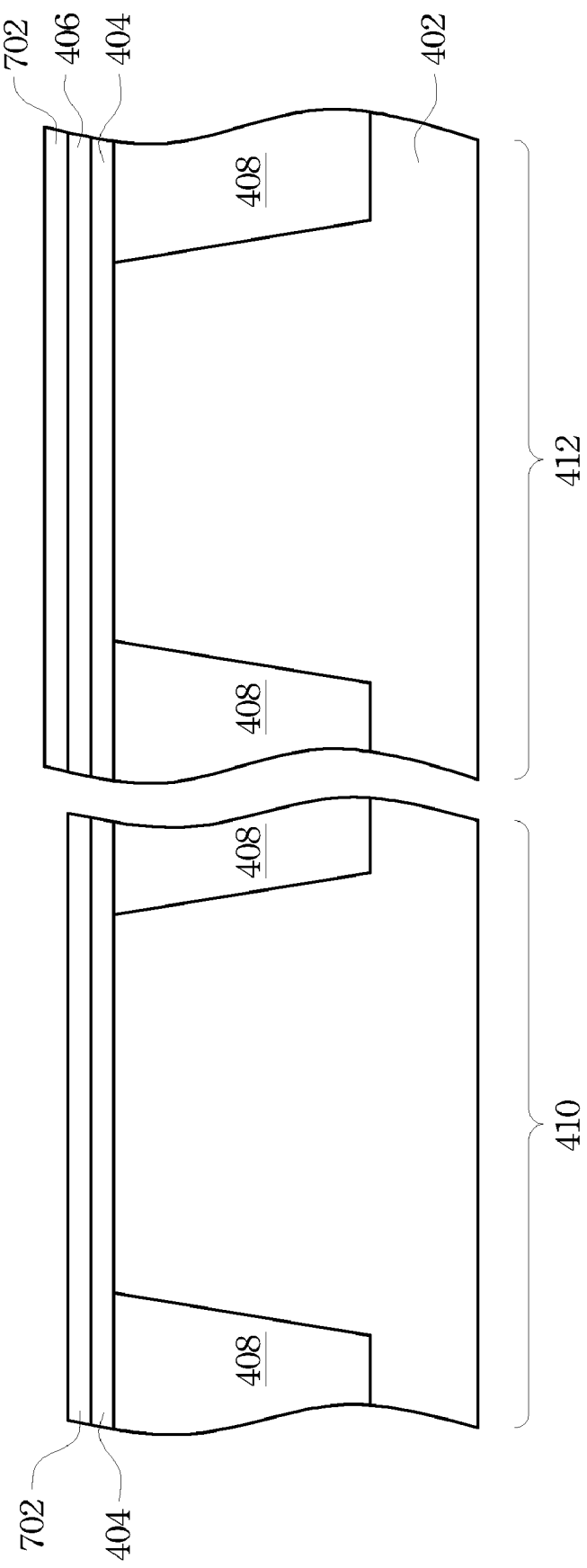

FIG. 7 illustrates the diffusion of the atomic layer 602 (see FIG. 6) into the first silicon-containing layer 406, thereby forming a p-type diffusion layer 702, in accordance with an embodiment of the present invention. The diffusion may be performed using an anneal, such as a rapid thermal anneal (RTA), a spike anneal, a laser anneal, a flash anneal, or the like. In an embodiment, an anneal is performed at a temperature between about 1000° C. and about 1350° C. for a duration ranging from 0.001 seconds to about 30 seconds.

As illustrated in FIG. 7, the diffusion of the atoms of the atomic layer 602 preferably results in a complete diffusion of the first silicon-containing layer 406 within the PMOS active region 410. However, because the first silicon-containing layer 406 was thinned or reduced in the PMOS active region 410, the first silicon-containing layer 406 is not completely diffused in the NMOS active region 412. Rather, the NMOS active region 412 has the p-type diffusion region 702 over an undoped layer of the first silicon-containing layer 406.

It should also be noted that the processes described above with reference to FIGS. 6 and 7 may be repeated multiple times in order to increase the dopant concentration in the first silicon-containing layer 406 to the desired amount.

Figure 8:
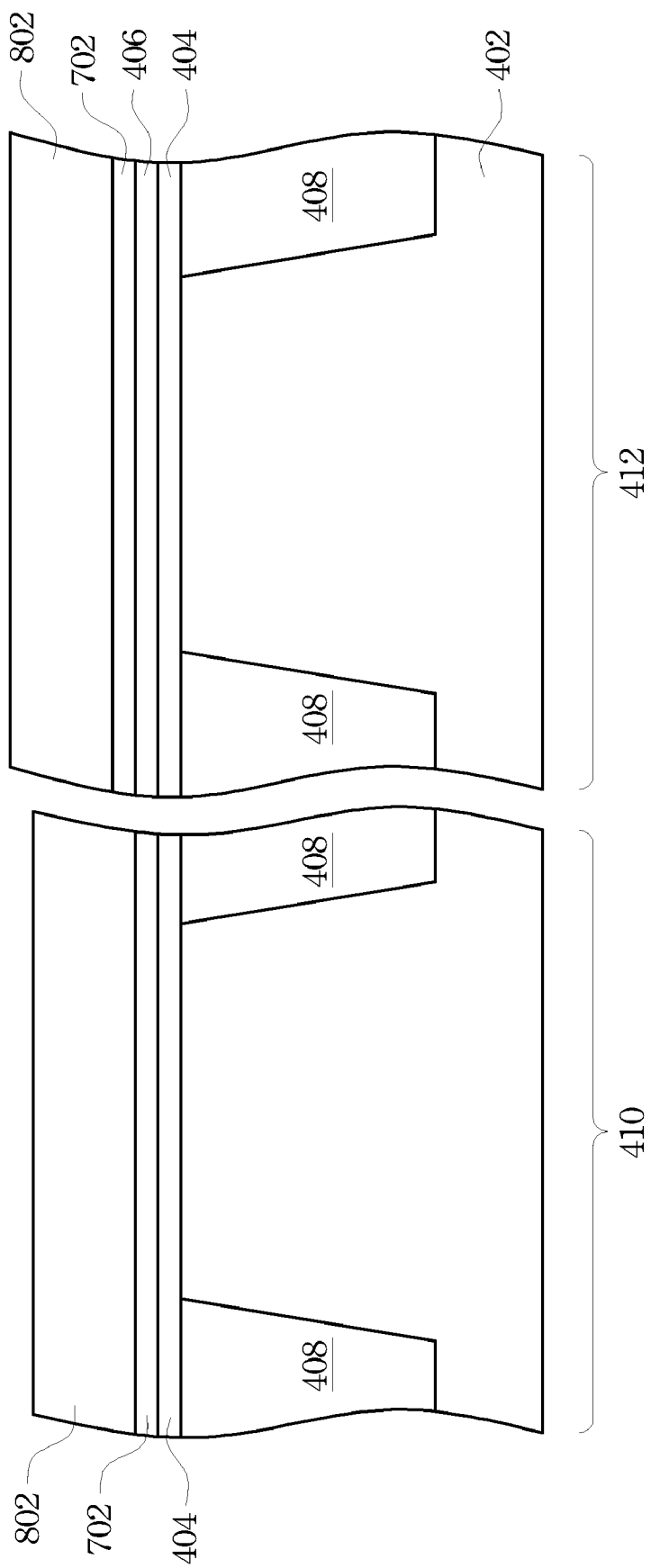

Referring to FIG. 8, a second silicon-containing layer 802 is blanket formed. The second silicon-containing layer 802 preferably comprises polysilicon, amorphous silicon, or silicon germanium. The formation of second silicon-containing layer 802 is similar to the formation of first silicon-containing layer 406, except p-type impurities are in-situ doped. P-type impurities, such as boron and/or indium, are preferably doped to a concentration of between about $5E20/cm^3$ and about $5E21/cm^3$. In an exemplary embodiment, the doping of the p-type impurities is achieved by simultaneously introducing silicon-containing precursors and impurity-containing process gases, such as $B_2H_6$, into the ambient. The thickness of second silicon-containing layer 802 is preferably between about 500 Å and about 2,500 Å. Alternatively, the second silicon-containing layer 802 may be doped by implantation.

Figure 9:
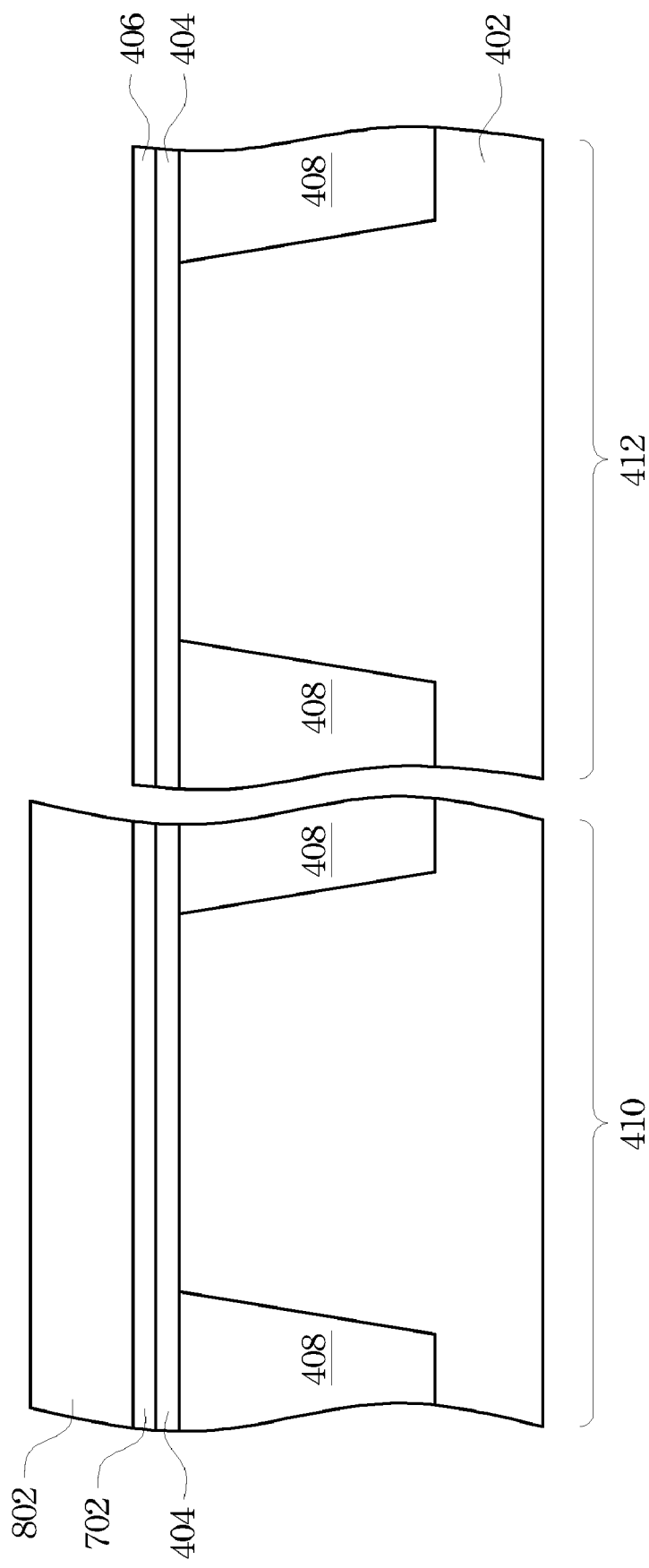

FIG. 9 illustrates the removal of the second silicon-containing layer 802 from the NMOS active region 412, which may be achieved by forming a photoresist (not shown) covering the PMOS active region 410, and etching portions of the second silicon-containing layer 802 in the NMOS active region 412.

Figure 10:
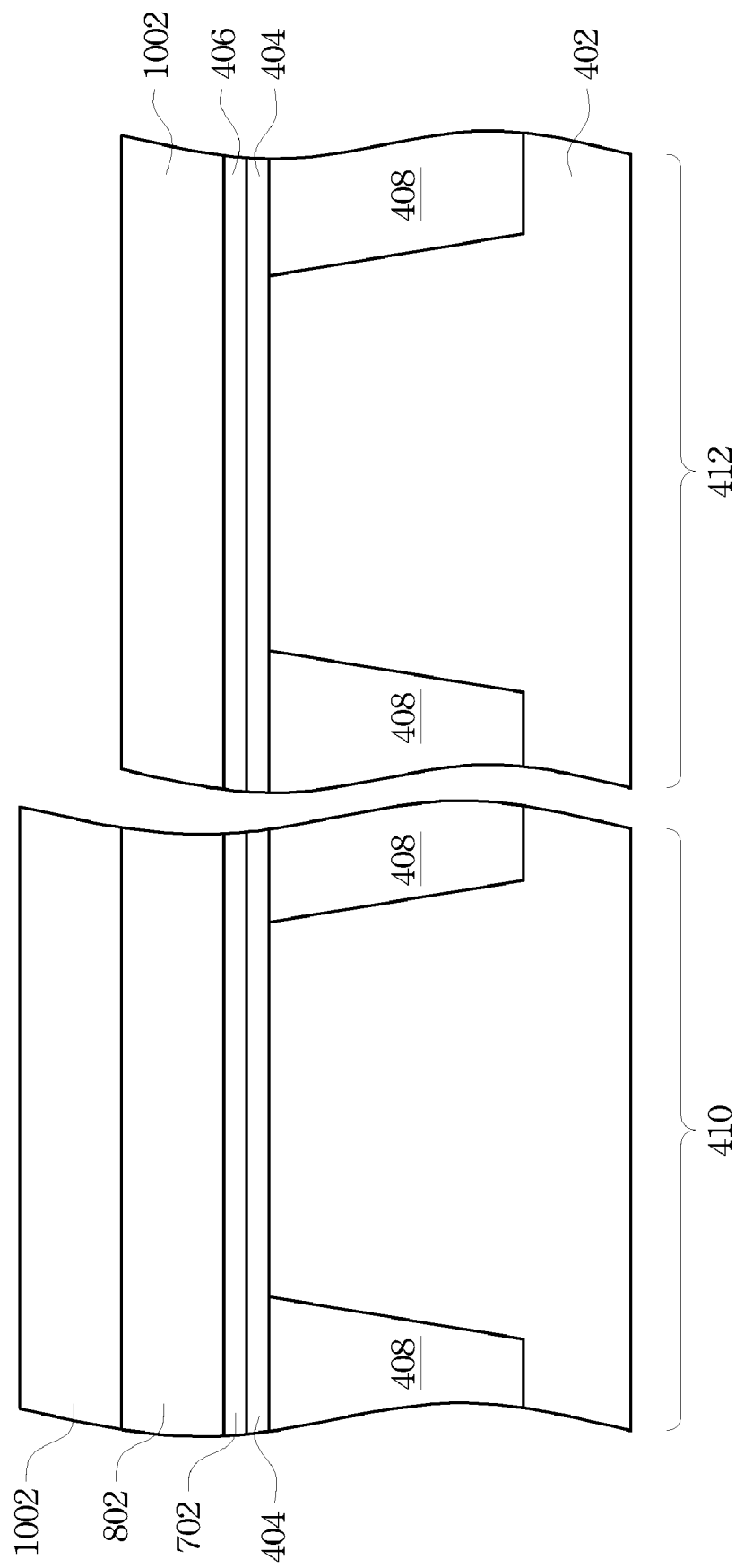

Referring to FIG. 10, a third silicon-containing layer 1002 is blanket formed. The third silicon-containing layer 1002 preferably comprises polysilicon, amorphous silicon, or silicon germanium. The formation of the third silicon-containing layer 1002 is similar to the formation of the second silicon-containing layer 802, except n-type impurities are in-situ doped, rather than p-type impurities. N-type impurities, such as phosphorous and/or arsenic, are preferably doped to a concentration of between about $5E20/cm^3$ and about $5E21/cm^3$. In an exemplary embodiment, the doping of the n-type impurities is achieved by simultaneously introducing silicon-containing precursors and impurity-containing process gases, such as $PH_3$, into the ambient. The thickness of the third silicon-containing layer 1002 is preferably between about 500 Å and about 2,500 Å, but more preferably similar to that of the second silicon-containing layer 802. Alternatively, the third silicon-containing layer 1002 may be doped by implantation.

Figure 11:
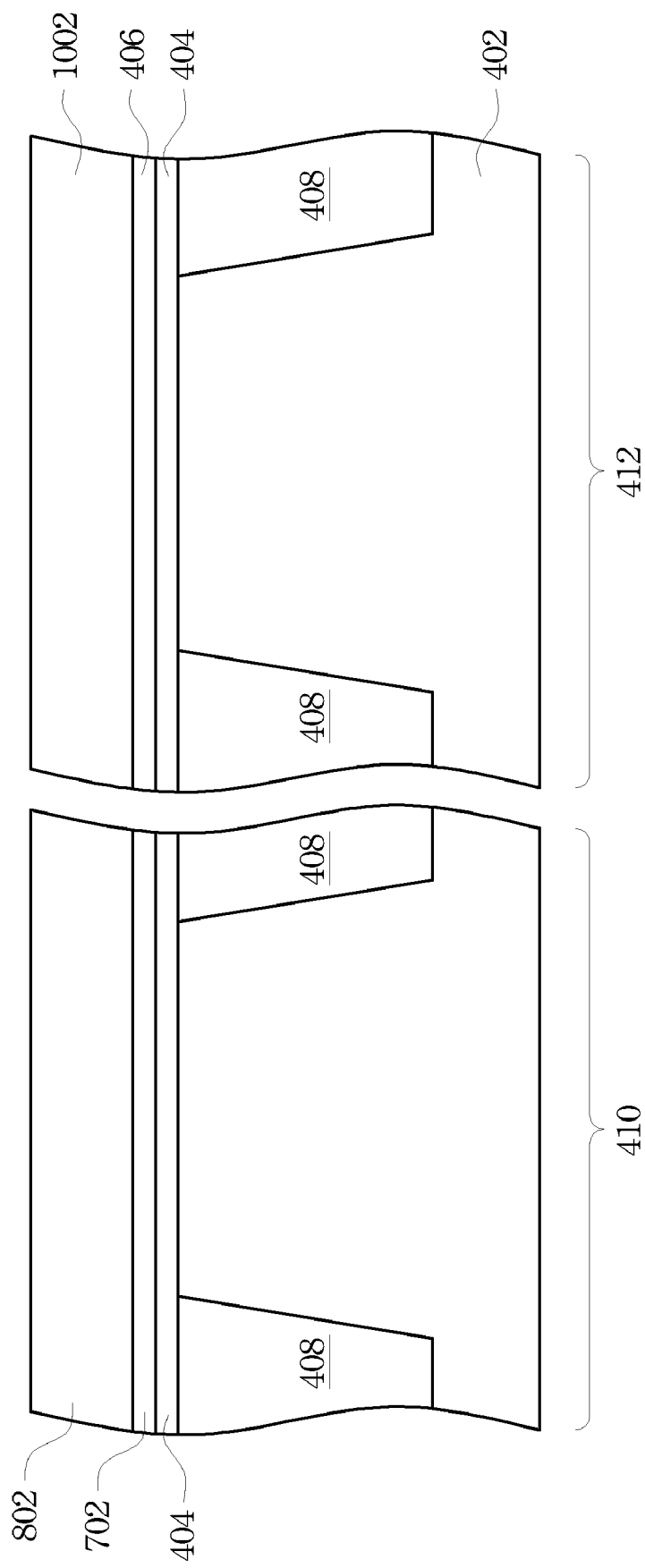

FIG. 11 illustrates the removal of the third silicon-containing layer 1002 from the PMOS active region 410, which may be achieved by forming a photoresist (not shown) covering the NMOS active region 412, and etching portions of the third silicon-containing layer 1002 in the PMOS active region 410.

Thereafter, processes may be performed to complete fabrication of the semiconductor device. For example, to form a transistor, the layers illustrated in FIG. 11 may be patterned and source/drain regions may be formed. Any suitable process and/or structure may be used.

Figure 12:
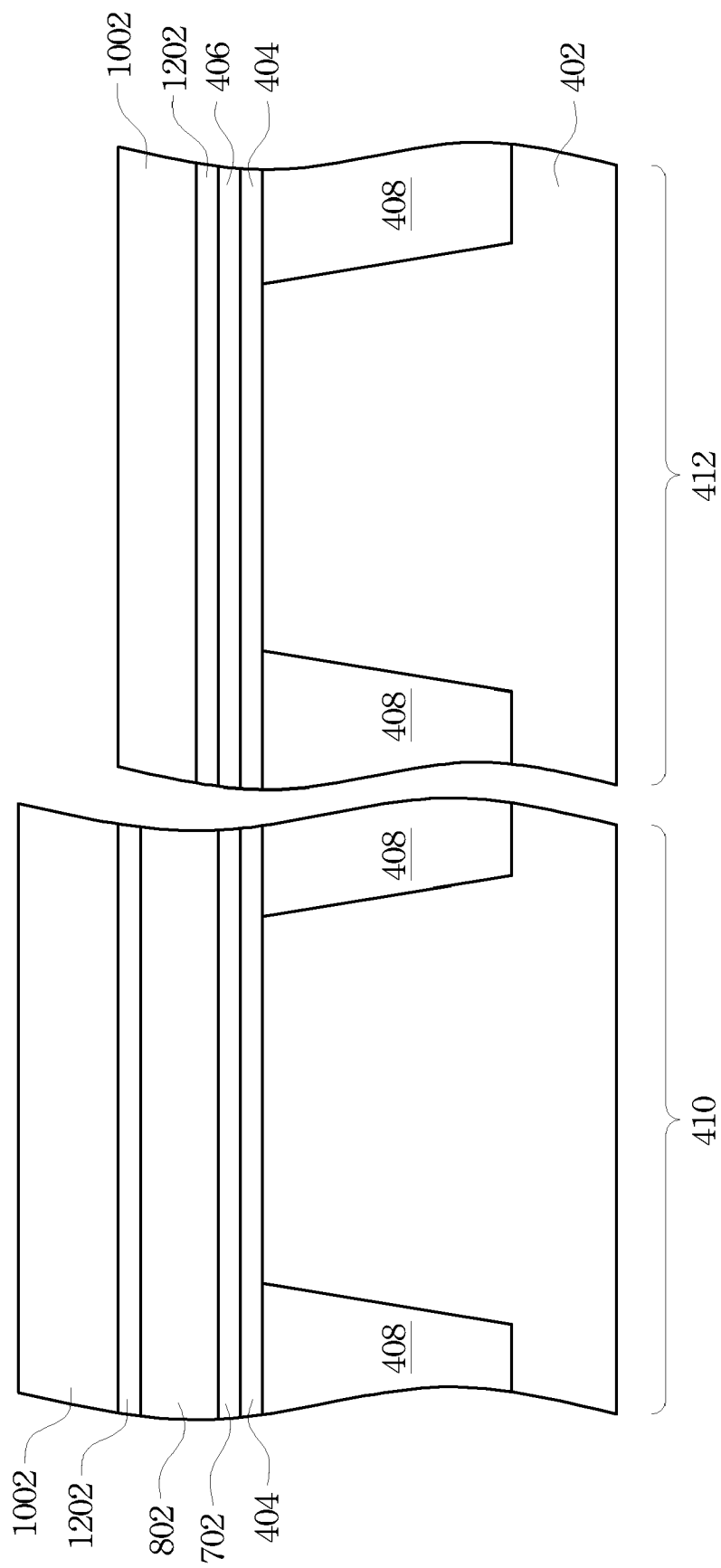
FIGS. 12 and 13 illustrate various intermediate process steps of another method of forming a semiconductor device.
Figure 13:
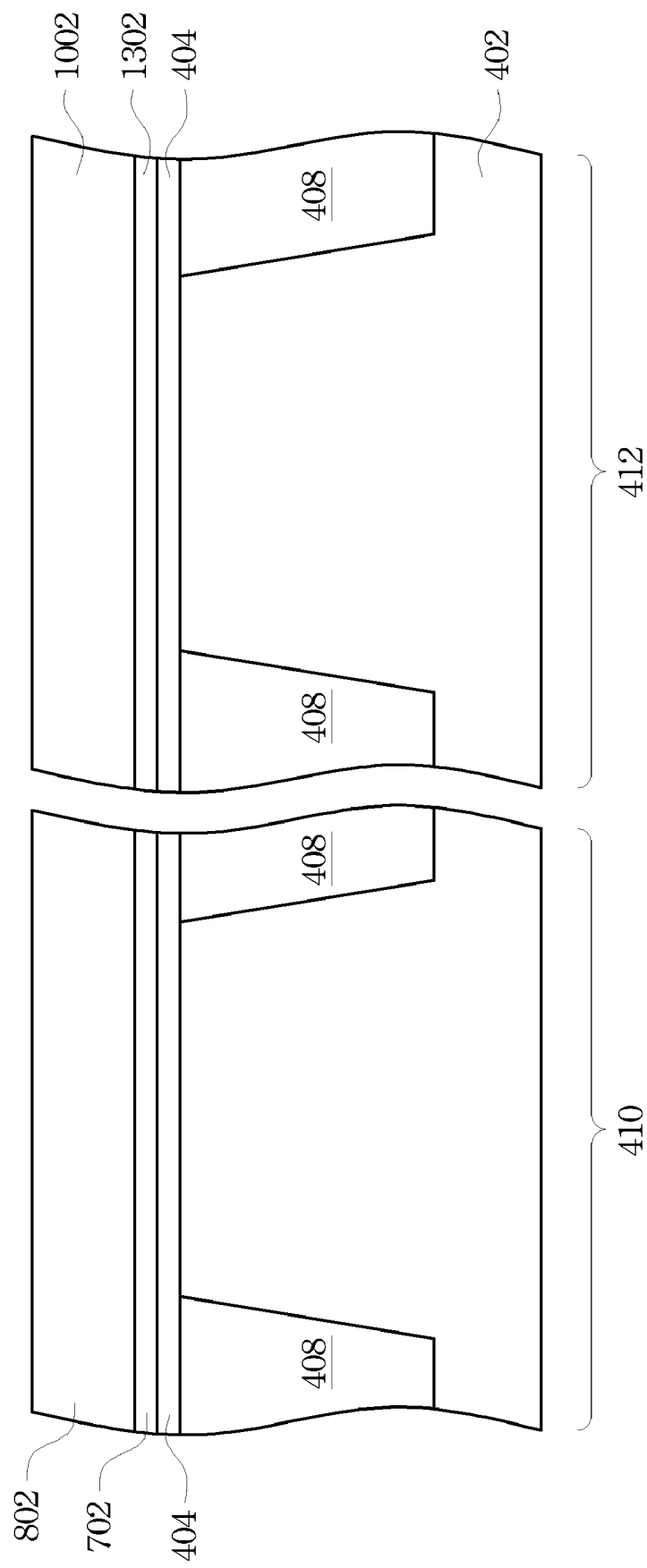

FIGS. 12 and 13 illustrate another method of forming a gate electrode having a reduced depletion area in accordance with an embodiment of the present invention. FIGS. 12 and 13 assume a starting structure similar to that illustrated in FIG. 9, wherein like reference numerals refer to like elements. Accordingly, FIG. 12 illustrates forming an n-type atomic layer 1202 over the first silicon-containing layer 406 in the NMOS active region 412 and over the second silicon-containing layer 802 in the PMOS active region 410 prior to forming the third silicon-containing layer 1002.

The n-type atomic layer 1202 may be formed, for example, using a reaction chamber at atmospheric or reduced pressure with a carrier gas such as $H_2/N_2$, $N_2/He$, $H_2/He$, or the like and a precursor of $PH_3$, $AsH_3$, or the like at a temperature between about 200° C. to about 600° C. Once formed, the third silicon-containing layer 1002 is formed over the n-type atomic layer 1202.

Thereafter, as illustrated in FIG. 13, the third silicon-containing layer 1002 and the n-type atomic layer 1202 are removed from the PMOS active region 410. The third silicon-containing layer 1002 and the n-type atomic layer 1202 may be removed from the PMOS active region 410 by forming a photoresist (not shown) covering the NMOS active region 412, and etching portions of the third silicon-containing layer 1002 and the n-type atomic layer 1202 in the PMOS active region 410.

The n-type atomic layer 1202 (see FIG. 12) may be diffused into the first silicon-containing layer 406 in the NMOS active region 412 by an anneal process, such as a RTA, a spike anneal, a laser anneal, a flash anneal, or the like. In an embodiment, an anneal is performed at a temperature between about 1000° C. and about 1350° C. for a duration ranging from 0.001 seconds to about 30 seconds. As a result of the anneal process, the first silicon-containing layer 406 becomes an n-type diffused layer 1302. It should be noted that the anneal may be performed before or after the removal of the third silicon-containing layer 1002 from the PMOS active region 410.

Thereafter, processes may be performed to complete fabrication of the semiconductor device. For example, to form a transistor, the layers illustrated in FIG. 13 may be patterned and source/drain regions may be formed. Any suitable process and/or structure may be used.

FIGS. 14-20 illustrate another method of forming gate electrodes having a reduced depletion area in accordance with another embodiment of the present invention. The method illustrated in FIGS. 14-20 assume a starting structure similar to that illustrated in FIG. 4, wherein like reference numerals refer to like elements.

Figure 14:
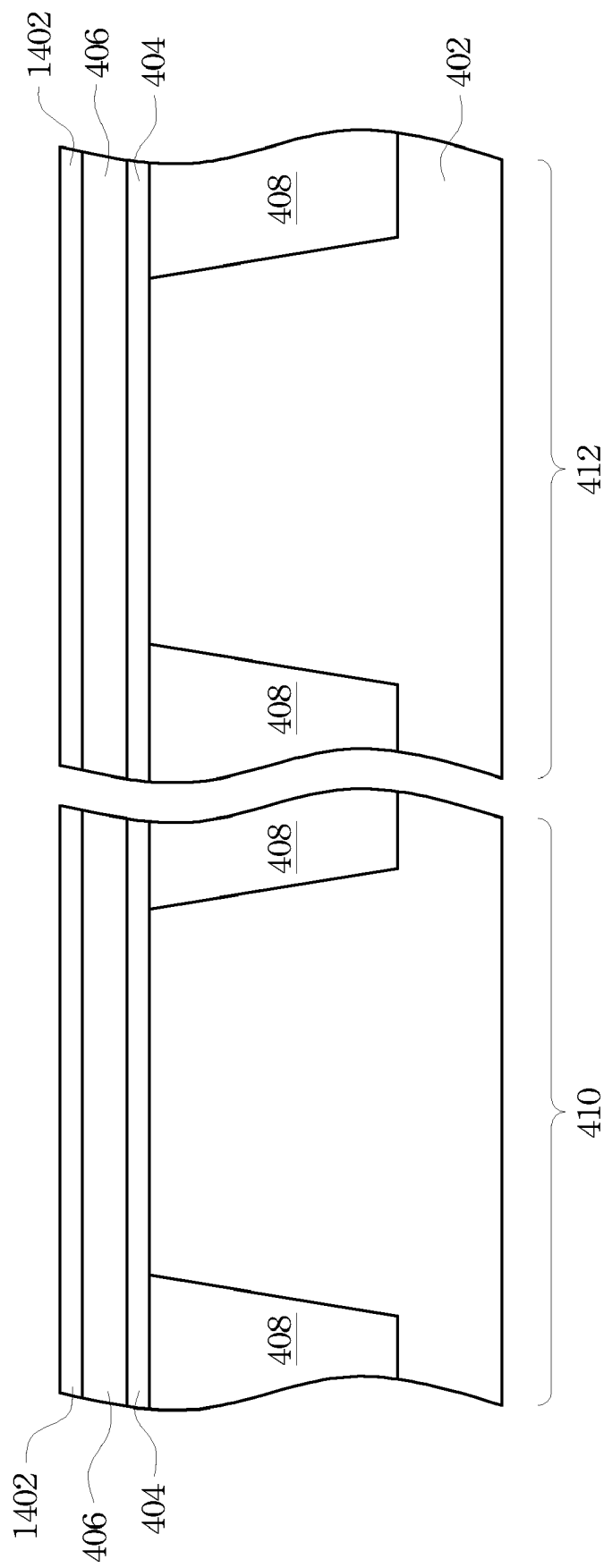
FIGS. 14-20 illustrate various intermediate process steps of yet another method of forming a semiconductor device.

Referring now to FIG. 14, a p-type atomic layer 1402 is formed over the first silicon-containing layer 406 in the PMOS active region 410 and the NMOS active region 412. In contrast to the embodiments discussed above wherein the first silicon-containing layer 406 was thinned in the PMOS active region 410, this embodiment leaves the first silicon-containing layer 406 at a similar thickness in both the PMOS active region 410 and the NMOS active region 412. The p-type atomic layer 1402 may be formed, for example, using a reaction chamber at atmospheric or reduced pressure with a carrier gas such as $H_2/N_2$, $N_2/He$, $H_2/He$, or the like and a precursor of $B_2H_6$ or the like at a temperature of between about 200° C. to about 600° C.

Figure 15:
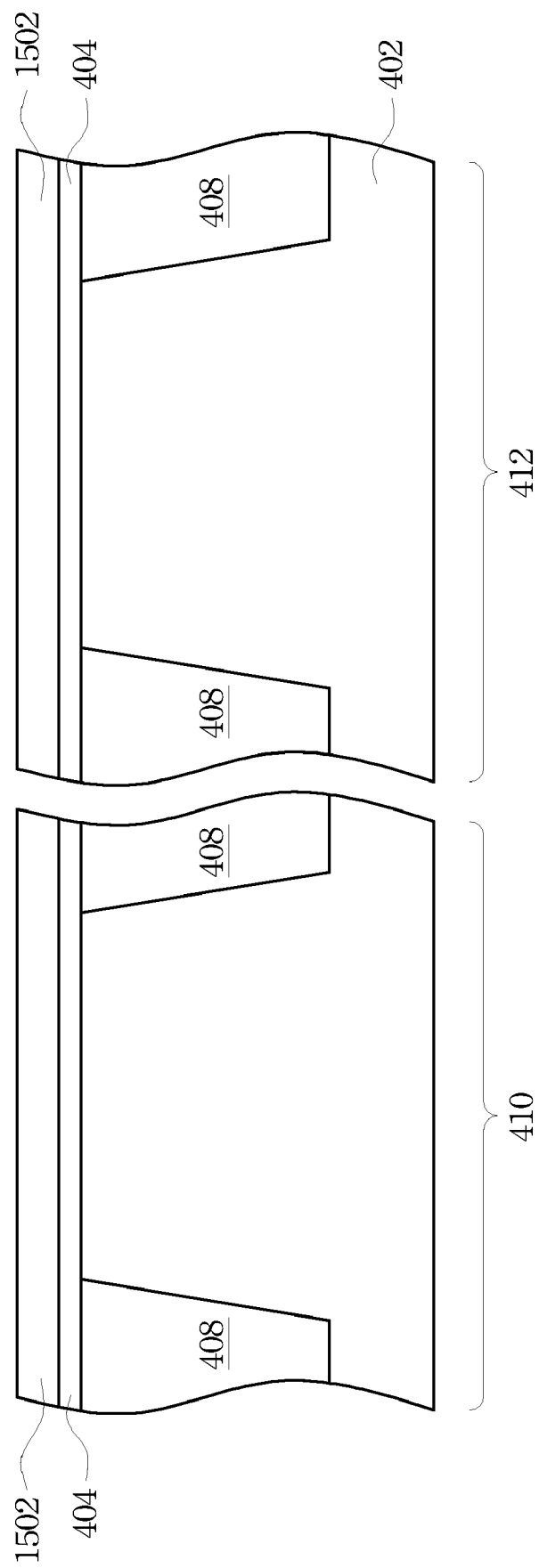

FIG. 15 illustrates the diffusion of the p-type atomic layer 1502 (see FIG. 14) into the first silicon-containing layer 406 (see FIG. 14), thereby forming a p-type diffusion layer 1502, in accordance with an embodiment of the present invention. The diffusion may be performed using an anneal, such as a RTA, a spike anneal, a laser anneal, a flash anneal, or the like. In an embodiment, an anneal is performed at a temperature between about 1000° C. and about 1350° C. for a duration ranging from 0.001 seconds to about 30 seconds. As illustrated in FIG. 15, the diffusion of the atoms of the p-type atomic layer 1402 preferably results in a complete diffusion of the first silicon-containing layer 406 within the PMOS active region 410 as well as the NMOS active region 412.

It should also be noted that the processes described above with reference to FIGS. 14 and 15 may be repeated multiple times in order to increase the dopant concentration and/or thickness in the p-type diffusion layer 1502 to the desired amount.

Figure 16:
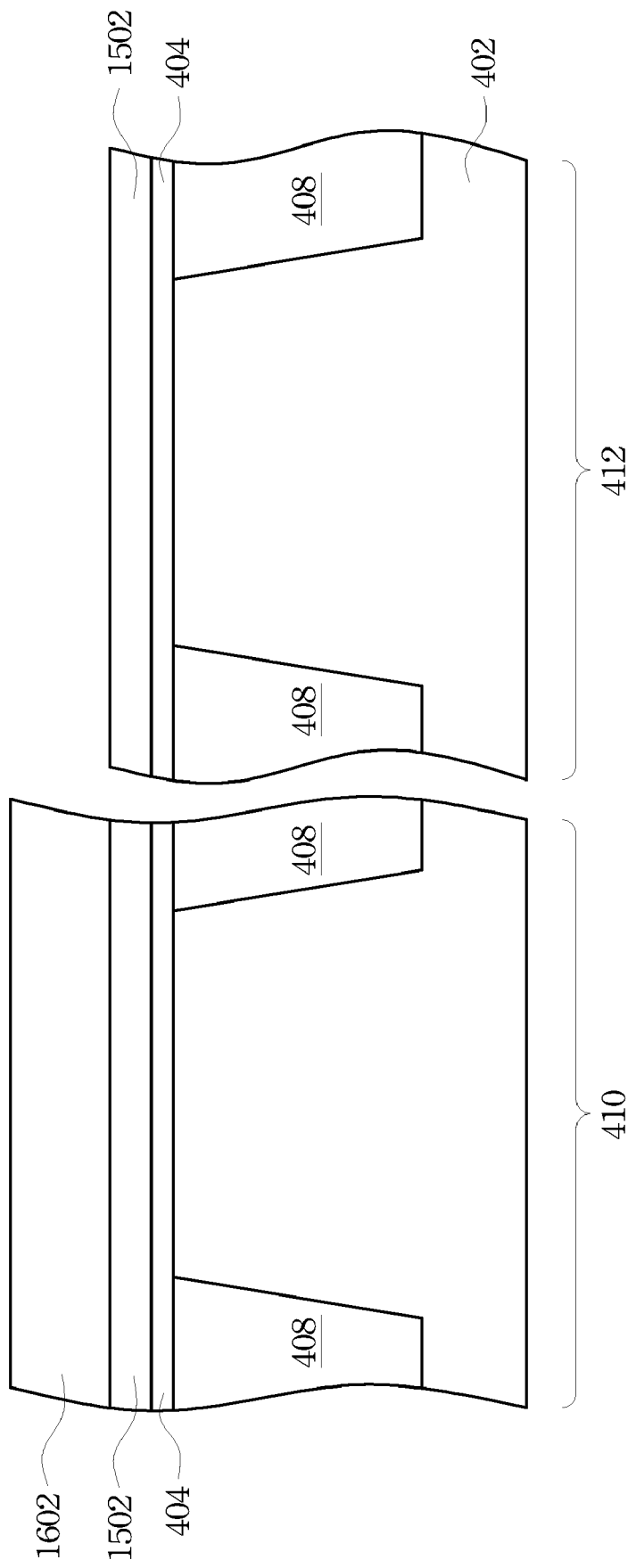

Referring to FIG. 16, a second silicon-containing layer 1602 is blanket formed and patterned in the PMOS active region 410. The second silicon-containing layer 1602 preferably comprises polysilicon, amorphous silicon, or silicon germanium. The formation of second silicon-containing layer 1602 is similar to the formation of the first silicon-containing layer 406, except p-type impurities are in-situ doped. P-type impurities, such as boron and/or indium, are preferably doped to a concentration of between about $5E20/cm^3$ and about $5E21/cm^3$. In an exemplary embodiment, the doping of the p-type impurities is achieved by simultaneously introducing silicon-containing precursors and impurity-containing process gases, such as $B_2H_6$, into the ambient. The thickness of second silicon-containing layer 1602 is preferably between about 500 Å and about 2,500 Å. Alternatively, the second silicon-containing layer 1602 may be doped by implantation.

The second silicon-containing layer 1602 may be removed from the NMOS active region 412 by forming a photoresist (not shown) covering the PMOS active region 410, and etching portions of the second silicon-containing layer 1602 in the NMOS active region 412.

Figure 17:
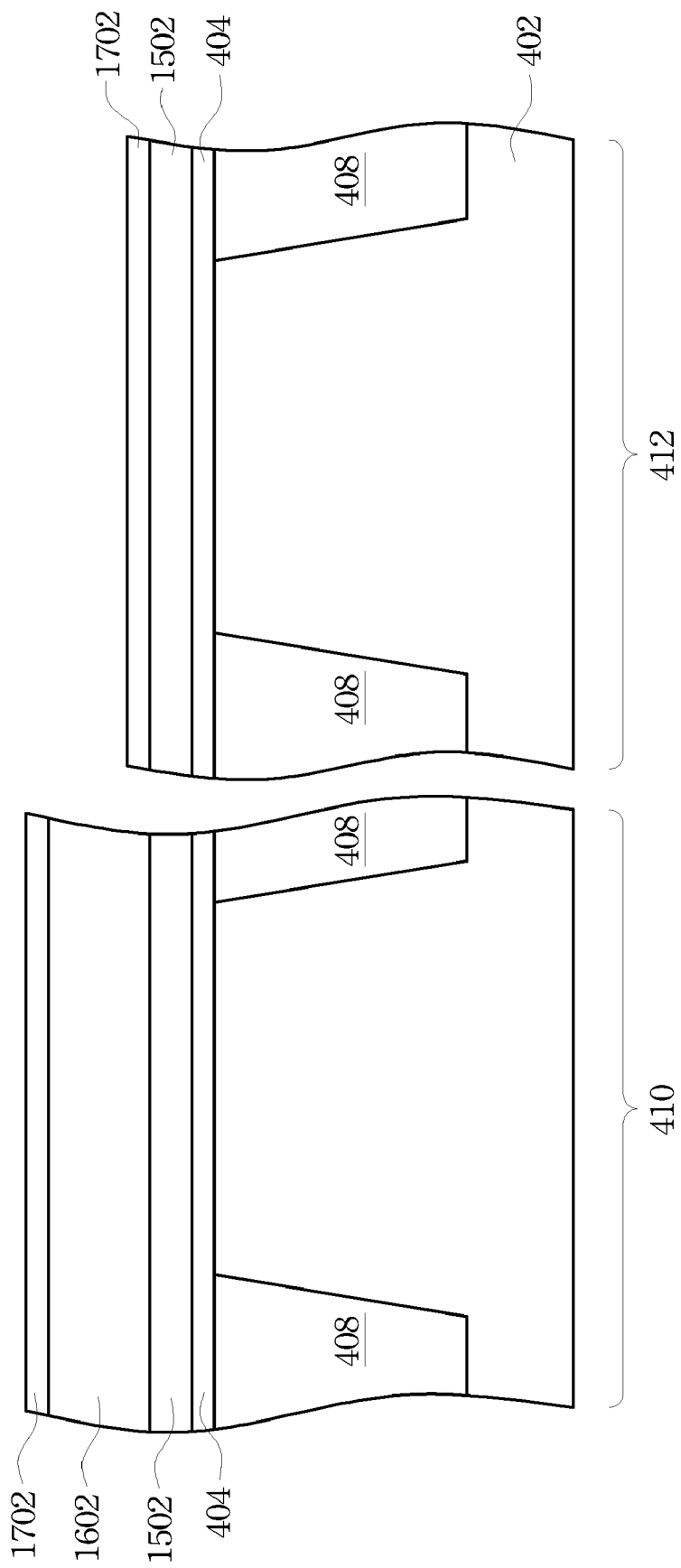

FIG. 17 illustrates forming an n-type atomic layer 1702 over the second silicon-containing layer 1602 in the PMOS active region 410 and over the p-type diffusion layer 1502 in the NMOS active region 412. The n-type atomic layer 1702 may be formed, for example, using a reaction chamber at atmospheric or reduced pressure with a carrier gas such as $H_2/N_2$, $N_2/He$, $H_2/He$, or the like and a precursor of $PH_3$, $AsH_3$, or the like at a temperature between about 200° C. to about 600° C.

Figure 18:
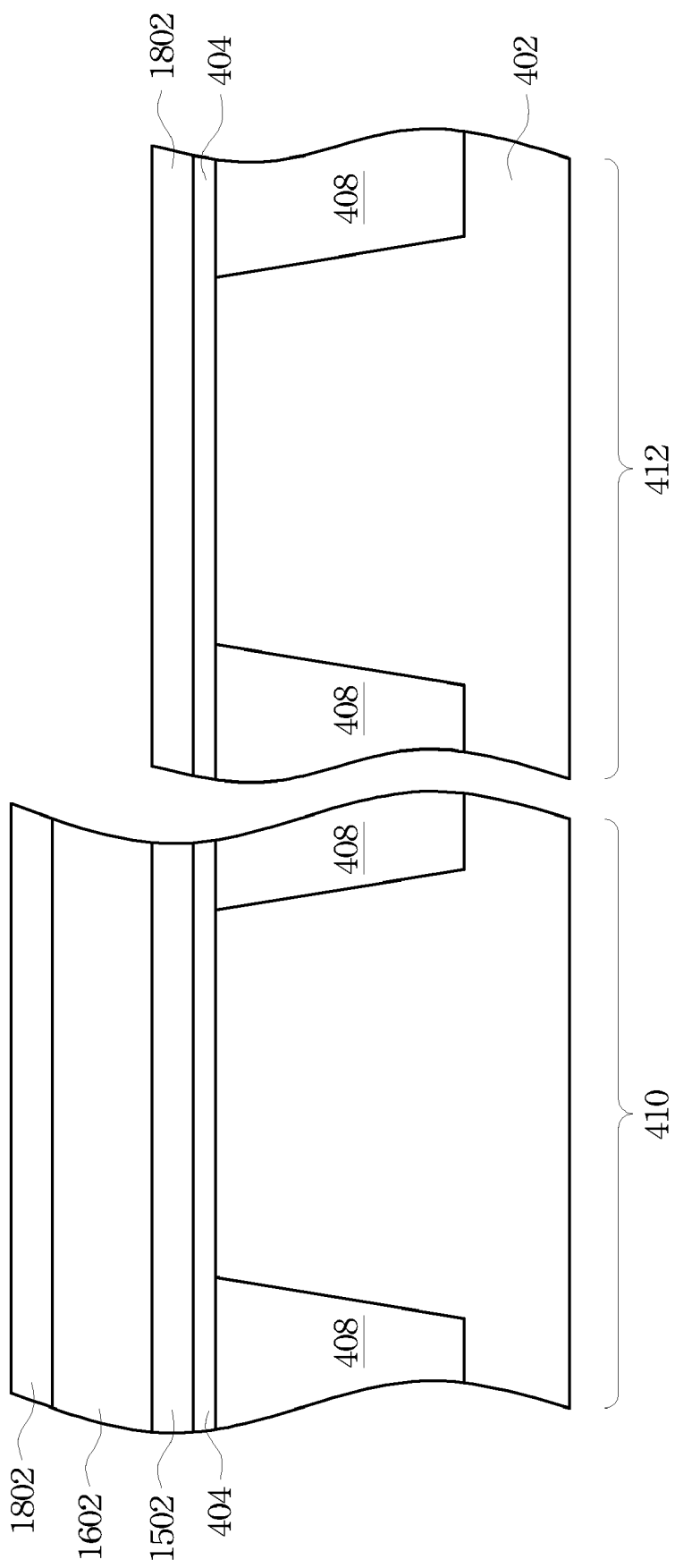

Once formed, a diffusion process is used to diffuse the n-type atomic layer 1702 into the first silicon-containing layer 406 in the NMOS active region 412 and the upper surface of the second silicon-containing layer 1602 in the PMOS active region 412, thereby forming an n-type diffusion layer 1802 as illustrated in FIG. 18. The diffusion may be performed using an anneal, such as a RTA, a spike anneal, a laser anneal, a flash anneal, or the like. In an embodiment, an anneal is performed at a temperature between about 1000° C. and about 1350° C. for a duration ranging from 0.001 seconds to about 30 seconds.

Figure 19:
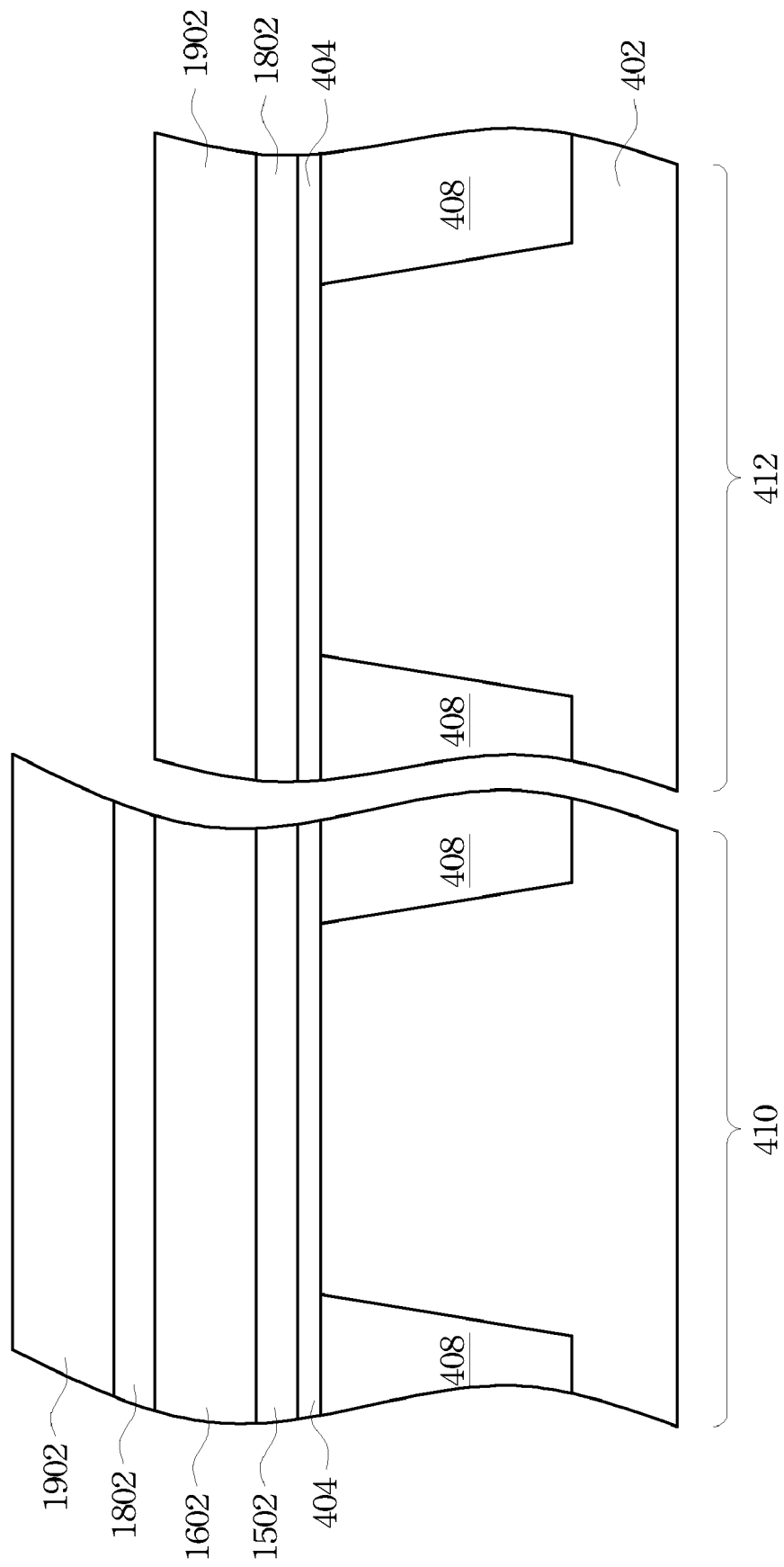

Referring to FIG. 19, a third silicon-containing layer 1902 is blanket formed over the PMOS active region 410 and the NMOS active region 412. The third silicon-containing layer 1902 preferably comprises polysilicon, amorphous silicon, or silicon germanium. The formation of the third silicon-containing layer 1902 is similar to the formation of the second silicon-containing layer 1602, except n-type impurities are in-situ doped. N-type impurities, such as phosphorous and/or arsenic, are preferably doped to a concentration of between about $5E20/cm^3$ and about $5E21/cm^3$. In an exemplary embodiment, the doping of the n-type impurities is achieved by simultaneously introducing silicon-containing precursors and impurity-containing process gases, such as $PH_3$, into the ambient. The thickness of the third silicon-containing layer 1902 is preferably between about 500 Å and about 2,500 Å, but more preferably a thickness similar to the thickness of the second silicon-containing layer 902. Alternatively, the third silicon-containing layer 1902 may be doped by implantation.

Figure 20:
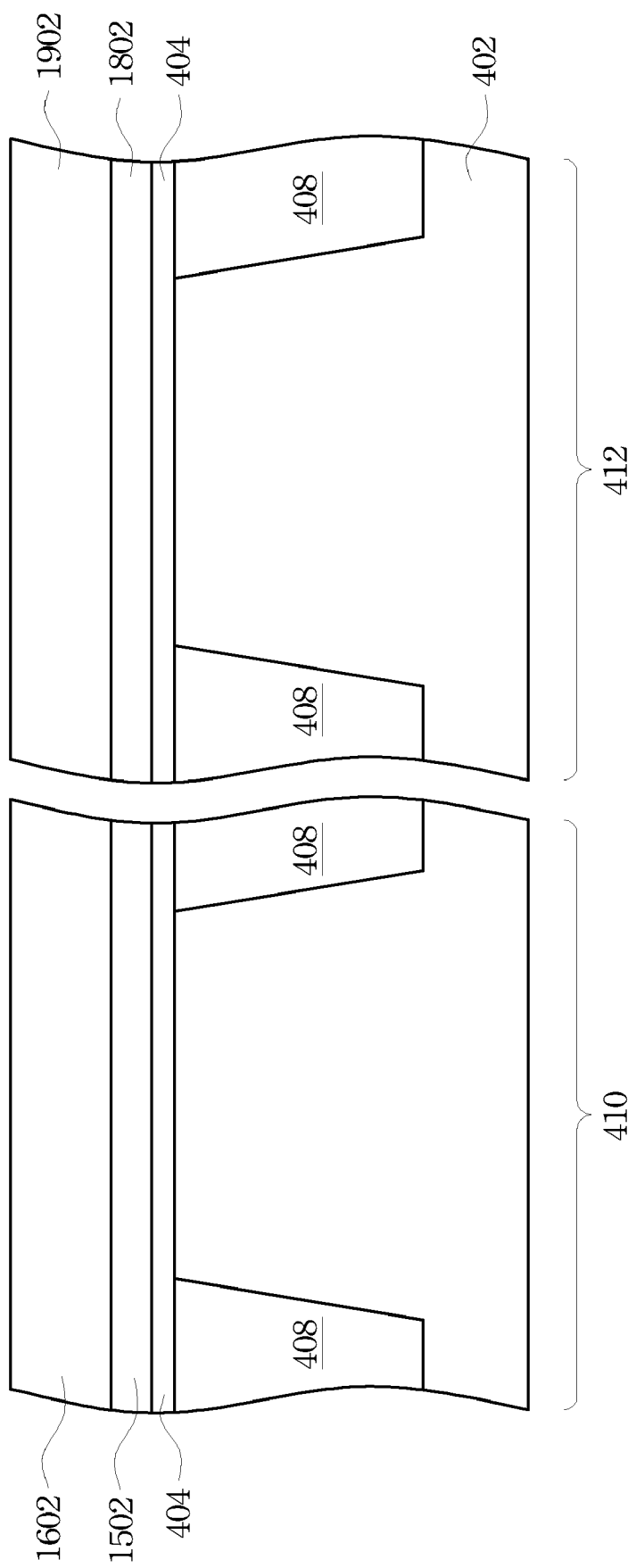

Thereafter, as illustrated in FIG. 20, the third silicon-containing layer 1902 and the n-type diffusion layer 1802 are removed from the PMOS active region 410. The third silicon-containing layer 1902 and the n-type diffusion layer 1802 may be removed from the PMOS active region 410 by forming a photoresist (not shown) covering the NMOS active region 412, and etching portions of the third silicon-containing layer 1902 and the n-type diffusion layer 1802 in the PMOS active region 410.

Thereafter, processes may be performed to complete fabrication of the semiconductor device. For example, to form a transistor, the layers illustrated in FIG. 20 may be patterned and source/drain regions may be formed. Any suitable process and/or structure may be used.

FIGS. 21-24 illustrate another method of forming a gate electrode having a reduced depletion area in accordance with another embodiment of the present invention. The method illustrated in FIGS. 21-24 assume a starting structure similar to that illustrated in FIG. 15, wherein like reference numerals refer to like elements.

Figure 21:
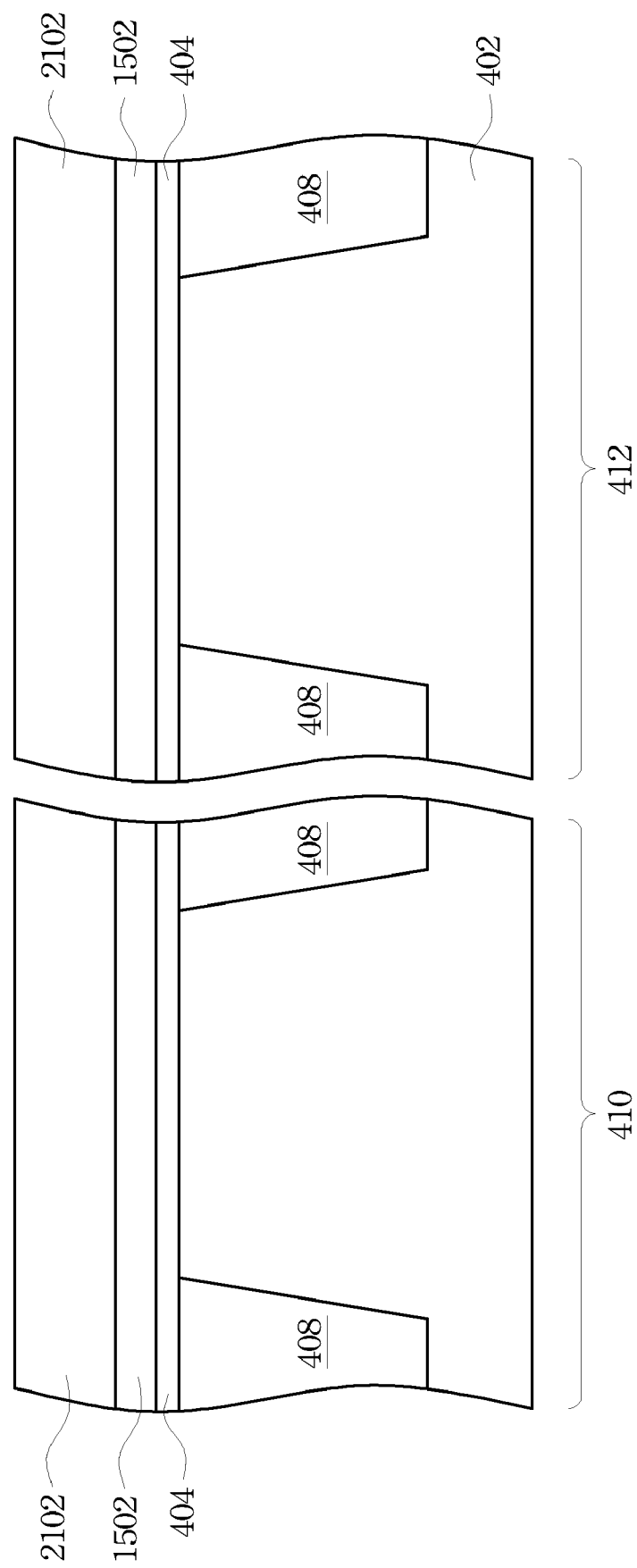
FIGS. 21-24 illustrate various intermediate process steps of yet another method of forming a semiconductor device.

Referring now to FIG. 21, a second silicon-containing layer 2102 is blanket formed in the PMOS active region 410 and the NMOS active region 412. The second silicon-containing layer 2102 preferably comprises an undoped layer of polysilicon, amorphous silicon, silicon germanium, or the like. The formation of the second silicon-containing layer 2102 is similar to the formation of first silicon-containing layer 406. The thickness of second silicon-containing layer 2102 is preferably between about 500 Å and about 2,500 Å.

Figure 22:
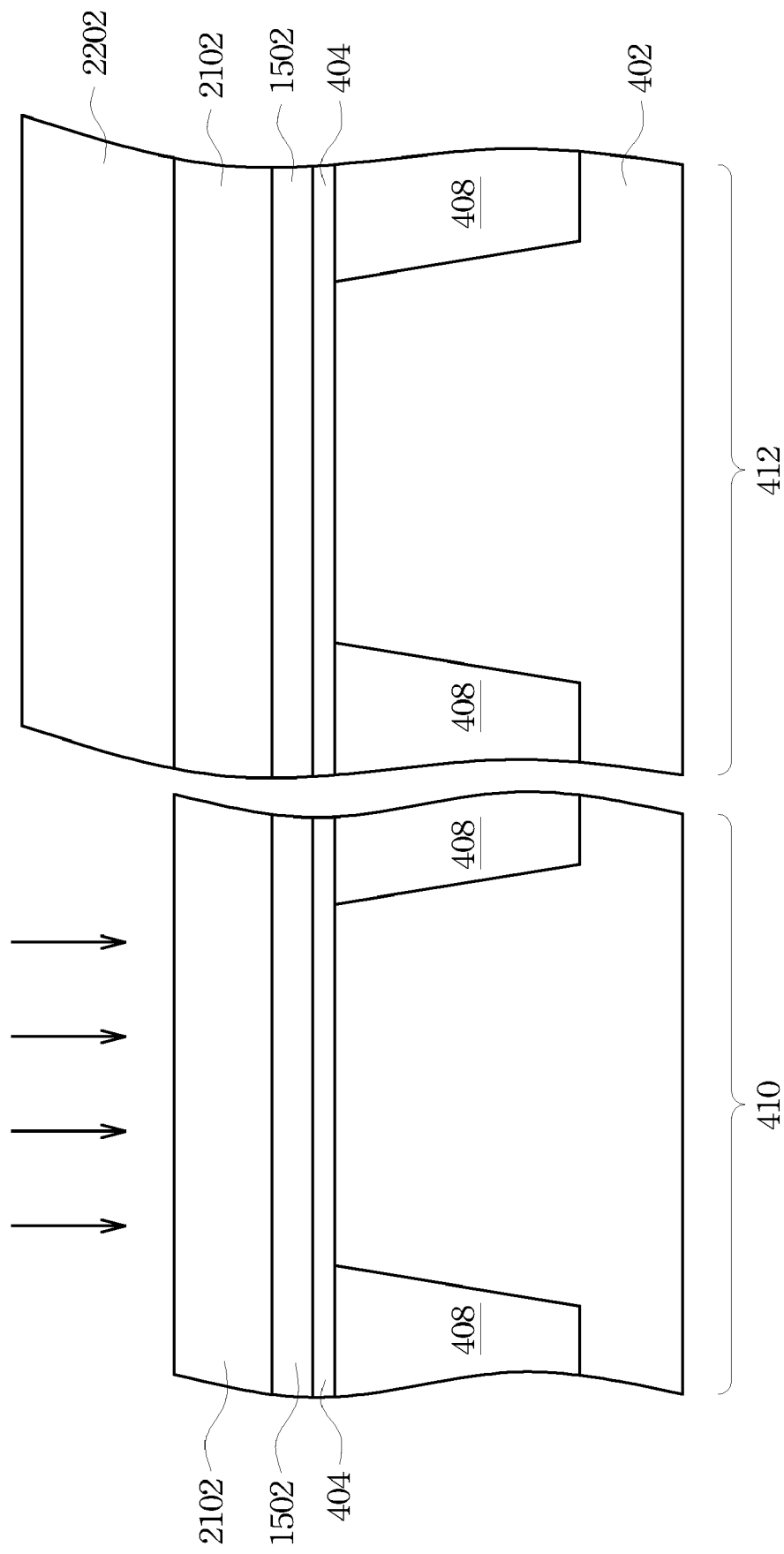

FIG. 22 illustrates the doping of the second silicon-containing layer 2102 in the PMOS active region 410 in accordance with an embodiment of the present invention. An implant mask 2202, such as a photoresist, is formed and patterned such that the NMOS active region 412 is protected during the p-type implant process for the PMOS active region 410. The second silicon-containing layer 2102 in the PMOS active region 410 may be doped, for example, with boron ions at a dose of about $1E13$ atoms/cm² to about $5E15$ atoms/cm² and at an energy of about 1 KeV to about 6 KeV.

Figure 23:
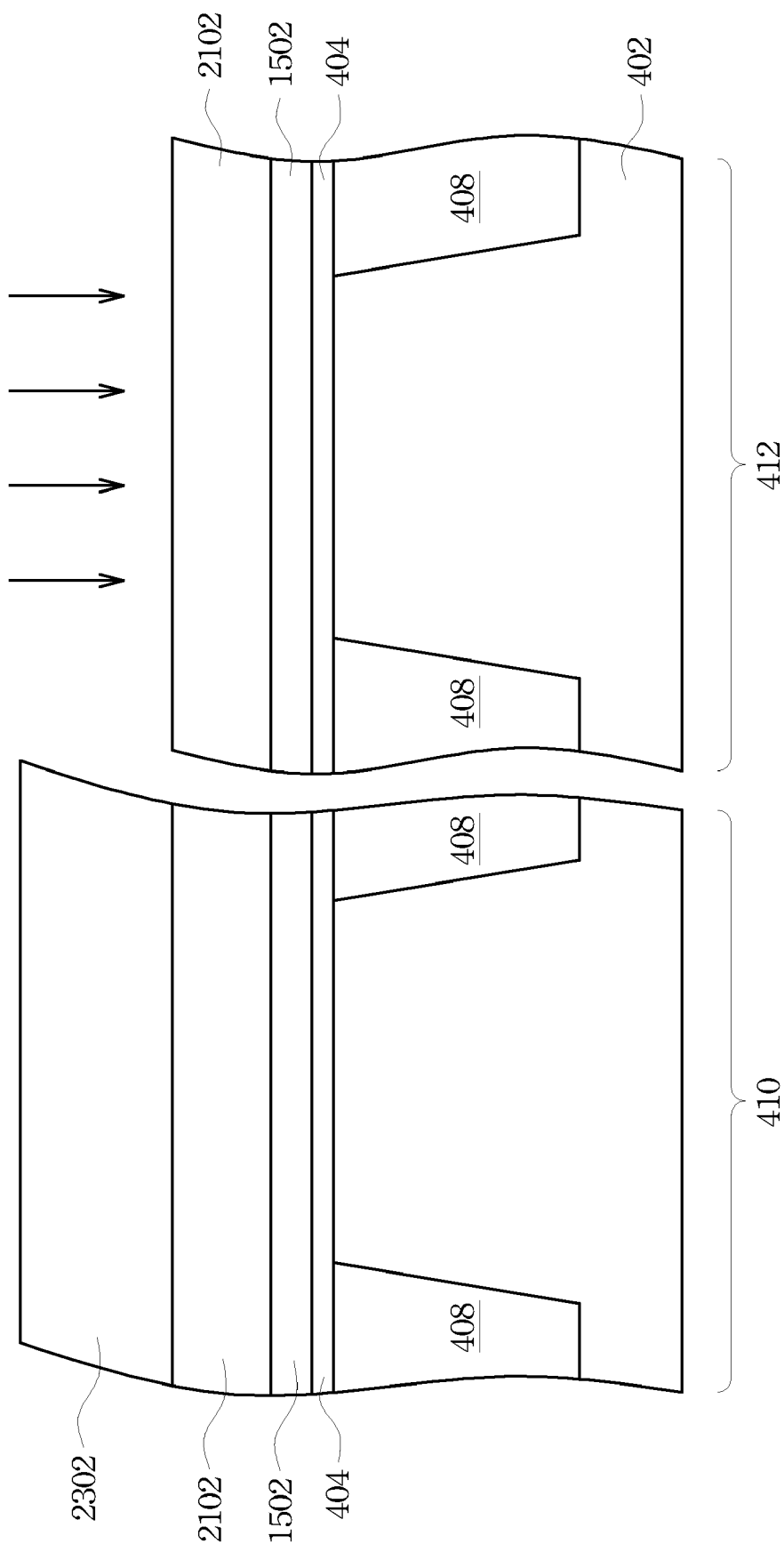

FIG. 23 illustrates removal of the implant mask 2202 and the doping of the second silicon-containing layer 2102 in the NMOS active region 412 in accordance with an embodiment of the present invention. An implant mask 2302, such as a photoresist, is formed and patterned such that the PMOS active region 410 is protected during the n-type implant process for the NMOS active region 412. The second silicon-containing layer 2102 in the NMOS active region 412 may be doped, for example, with phosphorous ions at a dose of about $5E14$ atoms/cm² to about $5E15$ atoms/cm² and at an energy of about 1 KeV to about 8 KeV.

Figure 24:
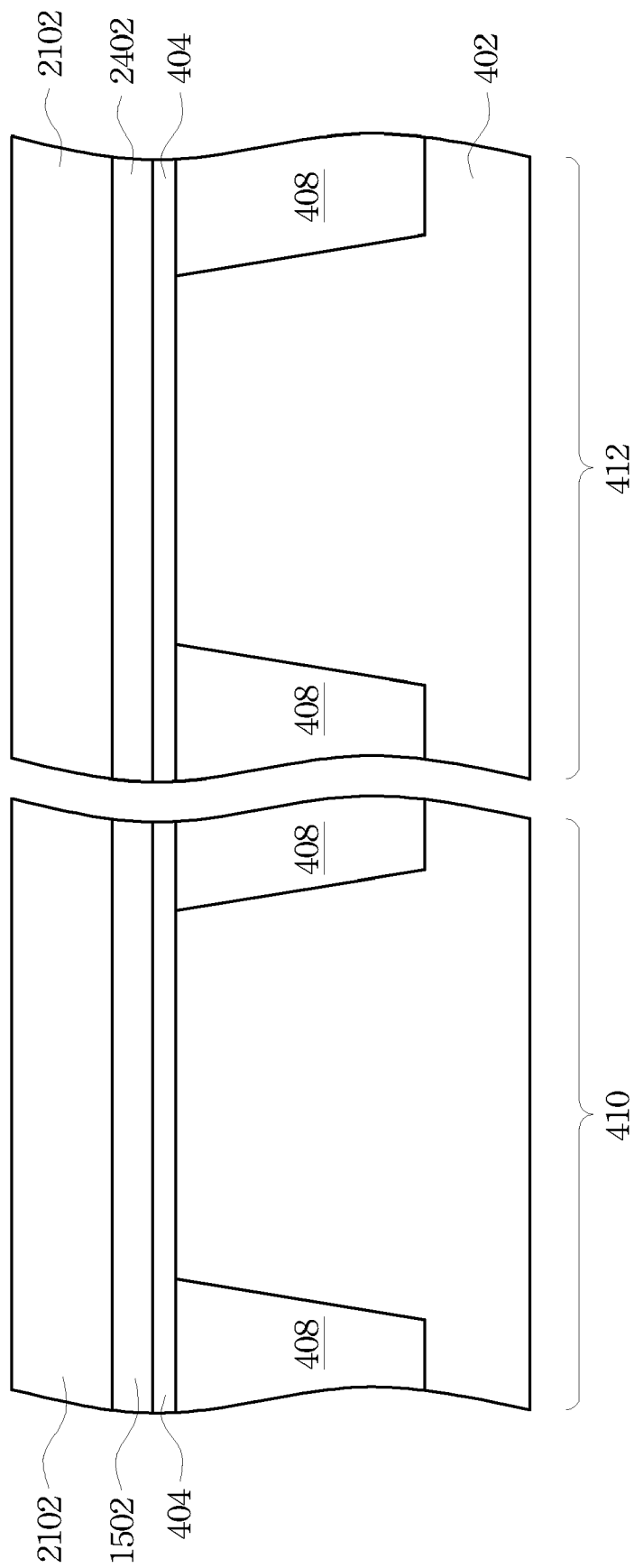

Thereafter, as illustrated in FIG. 24, the implant mask 2302 is removed and an anneal process is performed to diffuse and activate the implanted ions. The anneal also acts to diffuse n-type ions into the p-type diffusion layer 1502 (see FIG. 23) in the NMOS active region 412, thereby creating an n-type diffusion layer 2402. In an embodiment, an anneal is performed at a temperature between about 900° C. and about 1350° C. for a duration ranging from 0.001 seconds to about 150 seconds.

Thereafter, processes may be performed to complete fabrication of the semiconductor device. For example, to form a transistor, the layers illustrated in FIG. 24 may be patterned and source/drain regions may be formed. Any suitable process and/or structure may be used.

Figure 25:
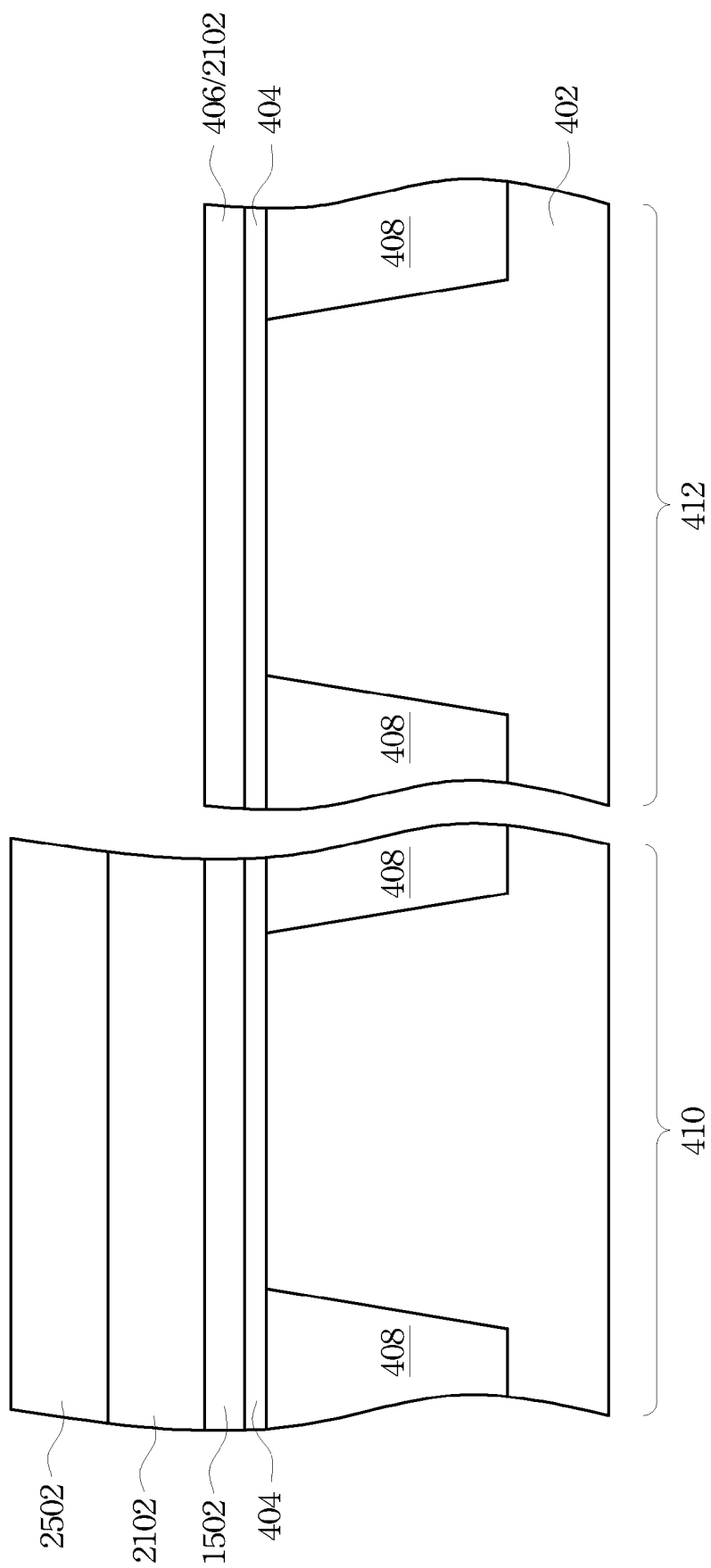
FIGS. 25-27 illustrate various intermediate process steps of yet another method of forming a semiconductor device.
Figure 26:
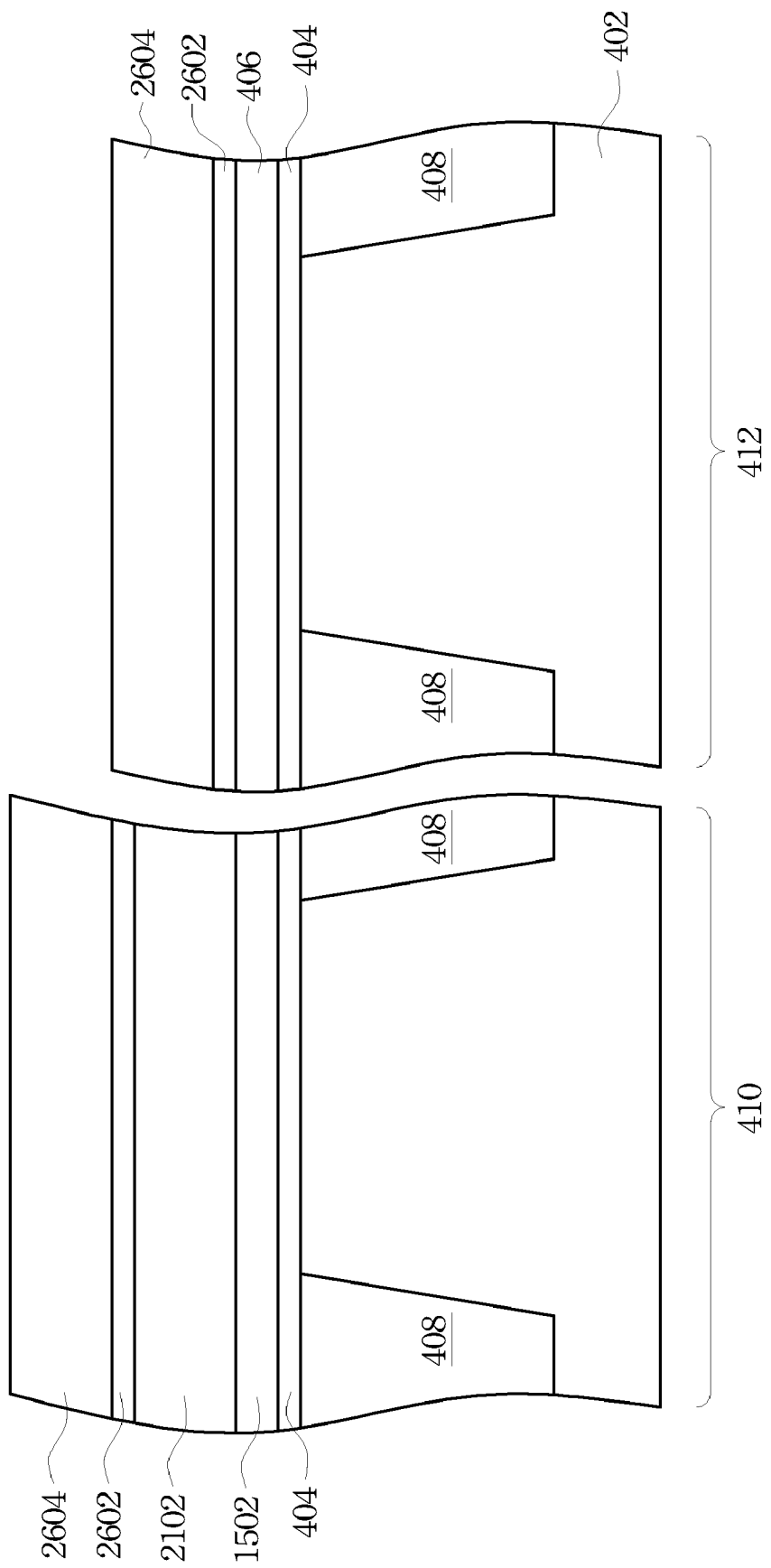
Figure 27:
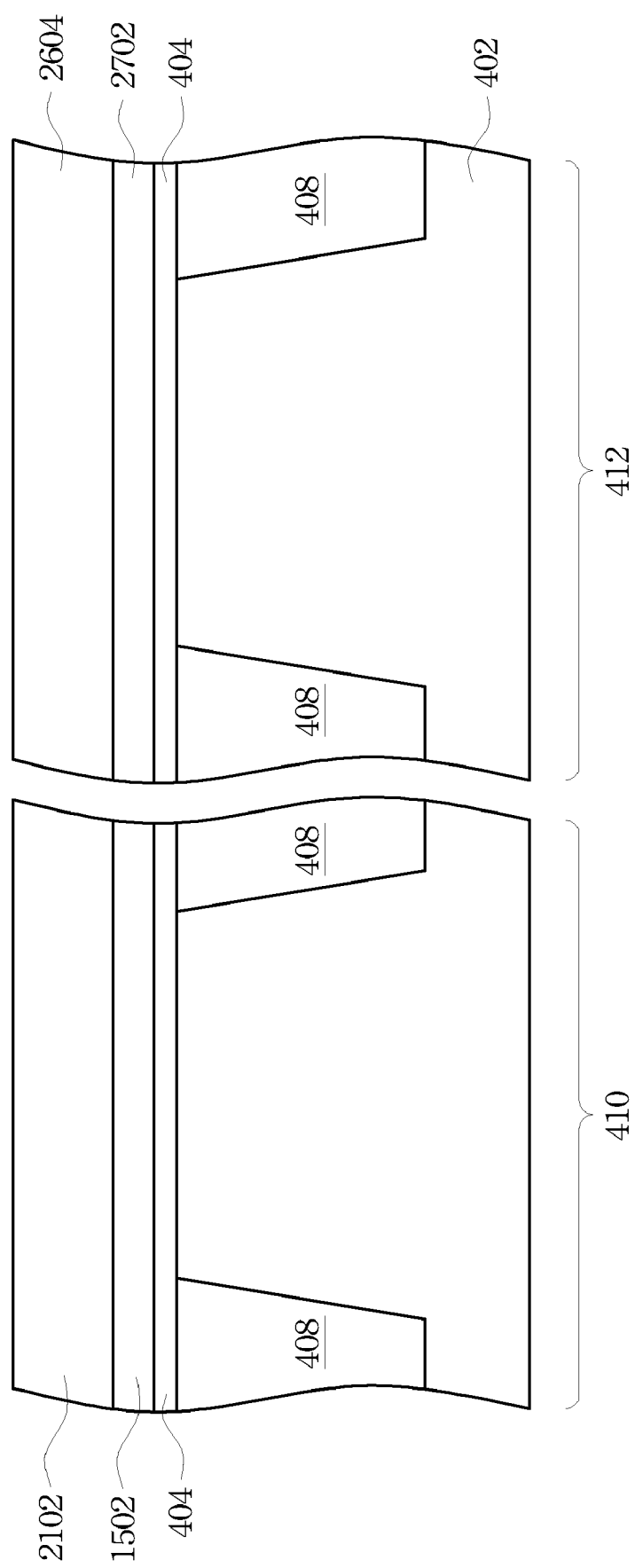

FIGS. 25-27 illustrate another method of forming a gate electrode having a reduced depletion area in accordance with another embodiment of the present invention. The method illustrated in FIGS. 25-27 assume a starting structure similar to that illustrated in FIG. 23, wherein like reference numerals refer to like elements.

Referring now to FIG. 25, after a mask 2502 is formed over the PMOS active region 410, a portion of the second silicon-containing layer 2102 formed in the NMOS active region is removed. In an exemplary embodiment, a photoresist is utilized as the mask 2502 to protect the PMOS active region 410. A timed dry etch is then performed by using, for example, HBr as an etchant such that only a portion of the second silicon-containing layer 2102 is removed from the NMOS active region 412. It should be appreciated that the remaining layer of the first silicon-containing layer 406 and/or the second silicon-containing layer 2102, which are doped with n-type dopants as a result of the implant process, protect the underlying gate dielectric layer 404 from becoming damaged during the etch process.

FIG. 26 illustrates removing the mask 2502 (see FIG. 25) and forming an n-type atomic layer 2602 over the PMOS active region 410 and the NMOS active region 412. The n-type atomic layer 2602 may be formed, for example, using a reaction chamber at atmospheric or reduced pressure with a carrier gas such as $H_2/N_2$, $N_2$/He, $H_2$/He, or the like and a precursor of $PH_3$, $AsH_3$, or the like at a temperature between about 200° C. to about 600° C. Once formed, the third silicon-containing layer 2604 is formed over the n-type atomic layer 2602.

Thereafter, as illustrated in FIG. 27, the third silicon-containing layer 2604 and the n-type atomic layer 2602 are removed from the PMOS active region 410. The third silicon-containing layer 2604 and the n-type atomic layer 2602 may be removed from the PMOS active region 410 by forming a photoresist (not shown) covering the NMOS active region 412, and etching portions of the third silicon-containing layer 2604 and the n-type atomic layer 2602 in the PMOS active region 410.

The n-type atomic layer 2602 may be diffused into the first silicon-containing layer 406 in the NMOS active region 412 by an anneal process, such as a RTA, a spike anneal, a laser anneal, a flash anneal, or the like. In an embodiment, an anneal is performed at a temperature between about 1000° C. and about 1350° C. for a duration ranging from 0.001 seconds to about 30 seconds. As a result of the anneal process, the first silicon-containing layer 406 and/or the second silicon-containing layer 2102 becomes an n-type diffused layer 2702. It should be noted that the anneal may be performed before or after the removal of the third silicon-containing layer 2604 from the PMOS active region 410.

Thereafter, processes may be performed to complete fabrication of the semiconductor device. For example, to form a transistor, the layers illustrated in FIG. 27 may be patterned and source/drain regions may be formed. Any suitable process and/or structure may be used.

Figure 28:
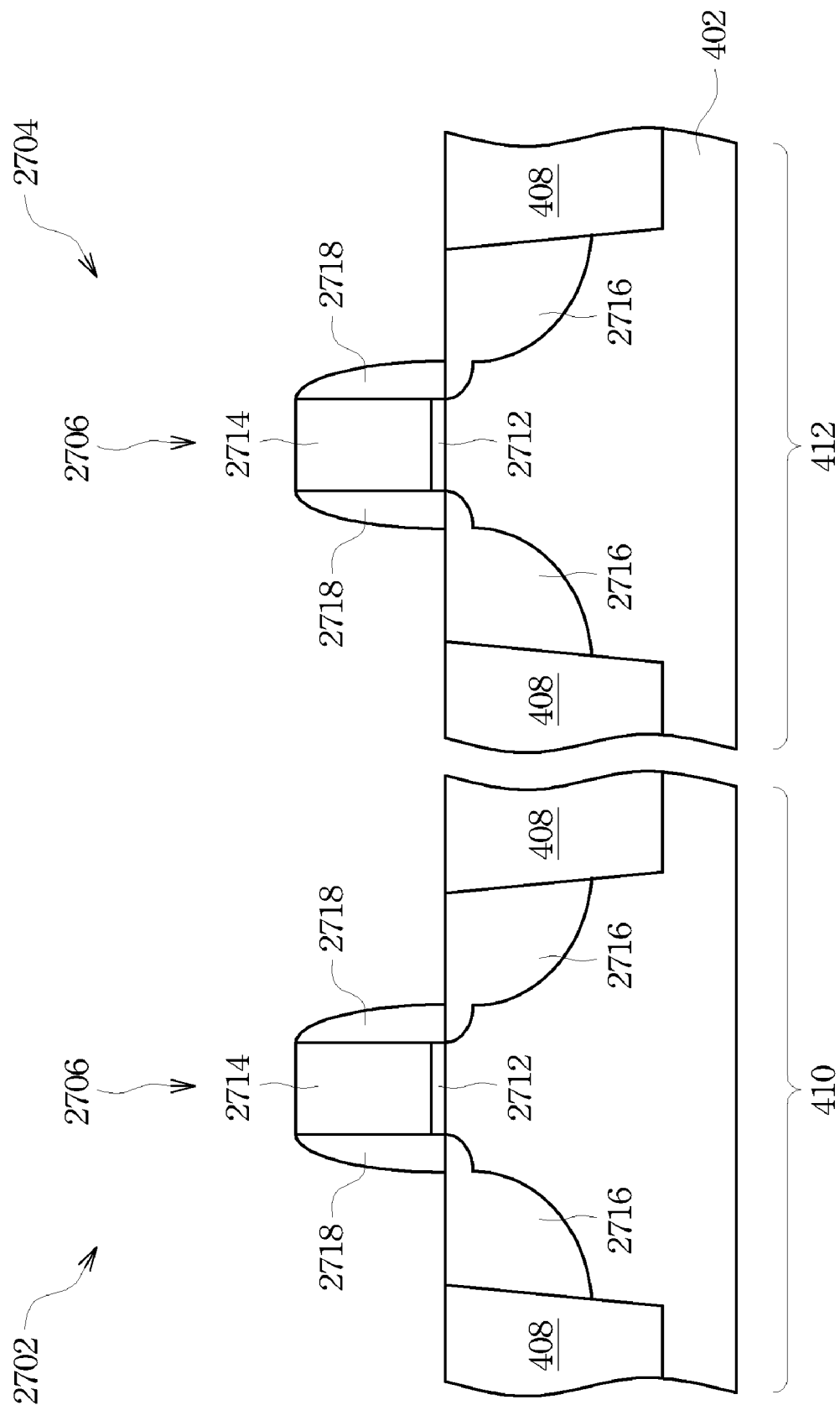
FIG. 28 illustrate pMOSFET and an nMOSFET formed using a gate stack in accordance with an embodiment of the present invention.

FIG. 28 illustrates a PMOS transistor 2702 and an NMOS transistor 2704 that may be fabricated using one or more of the embodiments of the present invention, including those embodiments discussed above. The transistors 2702/2704 include a gate stack 2706 comprising a gate dielectric layer 2712 and a gate electrode layer 2714, wherein the gate electrode layer 2714 includes an atomic-layer dopant controlled diffusion layer that reduces the depletion regions of the gate electrode layer 2714.

Source/drain regions 2716, including drain extensions, may be formed by any suitable process. The source/drain regions 2716 may be implanted, or in situ doped, with an n-type dopant, such as phosphorous, nitrogen, arsenic, antimony, or the like, to fabricate NMOS devices or may be implanted, or in situ doped, with a p-type dopant, such as boron, aluminum, indium, or the like, to fabricate PMOS devices. It may be necessary to utilize multiple masking and ion implant steps as are known in the art such that only specific areas are implanted with n-type and/or p-type ions.

Spacers 2718 may be used to offset the implant processes used to form the source/drain regions 2716. It should be noted that a silicidation process may be performed. The silicidation process may be used to improve the conductivity of the gate electrode layer 2714, as well as to decrease the resistance of source/drain regions 2716.

It should also be noted that the above description illustrates an example of one type of a transistor that may be used with an embodiment of the present invention and that other transistors and other semiconductor devices may also be used. For example, the transistor may have raised source/drains, different materials and thicknesses may be used, liners may be used between the spacer and the gate electrode, or the like.

In the foregoing specification, the invention has been described with reference to specific embodiments. However, various modifications and changes can be made by one skilled in the art without departing from the scope of the preferred embodiment. Accordingly, the specification and figures are to be regarded in an illustrative rather than a restrictive sense, and all such modifications are intended to be included within the scope of the preferred embodiment.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of making a semiconductor device, the method comprising:
    forming a gate dielectric layer on a semiconductor substrate;
    forming a first electrode layer on the gate dielectric, the first electrode layer being undoped;
    doping the first electrode layer, the doping being performed at least in part by atomic-layer doping; and
    forming a second electrode layer on the first electrode layer, the second electrode layer being doped.

2. The method of claim 1, further comprising thinning the first electrode layer prior to the doping.

3. The method of claim 1, wherein the second electrode layer is doped in situ.

4. The method of claim 1, wherein the doping the first electrode layer includes doping the first electrode layer for a first conductivity type, and further comprising doping the first electrode layer for a second conductivity type.

5. The method of claim 4, wherein the doping the first electrode layer for a second conductivity type is performed at least in part by atomic-layer doping.

6. The method of claim 1, wherein the first electrode layer is doped to a first conductivity type, and further comprising:
    doping a portion of the second electrode layer to a second conductivity type; and
    removing the portion of the second electrode layer doped to the second conductivity type.

7. The method of claim 1, wherein the forming the second electrode layer includes forming an undoped layer and doping the undoped layer by implanting ions.

8. The method of claim 1, wherein the forming the second electrode layer includes in situ doping the second electrode.

9. A method of forming a semiconductor device, the method comprising:
    forming a gate dielectric layer on a semiconductor substrate in a PMOS region and an NMOS region;
    forming a first electrode layer on the gate dielectric layer in the PMOS region and the NMOS region, the first electrode layer being undoped;
    doping the first electrode layer to a first conductivity type, the doping being performed at least in part by atomic-layer doping;
    forming a second electrode layer on the first electrode layer;
    removing the second electrode layer in the NMOS region; and forming a third electrode layer on the first electrode layer in the NMOS region.

10. The method of claim 9, further comprising forming an atomic layer on the second electrode layer in the PMOS region.

11. The method of claim 9, wherein at least a portion of the first electrode layer is removed in the PMOS region prior to the doping the first electrode layer.

12. The method of claim 11, wherein the doping the first electrode layer only dopes an upper region of the first electrode layer in the NMOS region.

13. The method of claim 12, further comprising removing the doped portion of the first electrode layer in the NMOS region.

14. The method of claim 9, further comprising doping the first electrode layer in the NMOS region to the second conductivity type using atomic-layer doping.

15. A method of forming a semiconductor device, the method comprising:
   forming a dielectric layer on a semiconductor substrate in a first region and a second region;
   forming a first silicon-containing layer on the dielectric in the first region and the second region, the first silicon-containing layer being undoped;
   forming an atomic layer of a first conductivity type on the first silicon-containing layer;
   annealing the semiconductor substrate;
   forming a second silicon-containing layer on the first silicon-containing layer;
   removing the second silicon-containing layer in the second region; and
   forming a third silicon-containing layer on the first silicon-containing layer in the second region.

16. The method of claim 15, further comprising removing at least a portion of the first silicon-containing layer in the first region prior to the forming the atomic layer on the first silicon-containing layer.

17. The method of claim 15, further comprising forming an atomic layer of a second conductivity type on the first silicon-containing layer in the second region and annealing the semiconductor substrate.

18. The method of claim 17, further comprising removing a portion of the first silicon-containing layer in the second region prior to forming the atomic layer of the second conductivity type.

19. The method of claim 15, wherein the third silicon-containing layer is doped in situ.

20. The method of claim 15, wherein the second silicon-containing layer is doped in situ.

* * * * *